United States Patent
Qi et al.

(10) Patent No.: US 10,276,689 B2
(45) Date of Patent: Apr. 30, 2019

(54) METHOD OF FORMING A VERTICAL FIELD EFFECT TRANSISTOR (VFET) AND A VFET STRUCTURE

(71) Applicant: GLOBALFOUNDRIES INC., Grand Cayman (KY)

(72) Inventors: Yi Qi, Niskayuna, NY (US); Jianwei Peng, Latham, NY (US); Hsien-Ching Lo, Clifton Park, NY (US); Ruilong Xie, Schenectady, NY (US); Xunyuan Zhang, Albany, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 11 days.

(21) Appl. No.: 15/615,925

(22) Filed: Jun. 7, 2017

(65) Prior Publication Data
US 2018/0358452 A1 Dec. 13, 2018

(51) Int. Cl.
H01L 29/66 (2006.01)
H01L 29/08 (2006.01)
H01L 29/78 (2006.01)

(52) U.S. Cl.
CPC .... *H01L 29/66666* (2013.01); *H01L 29/0847* (2013.01); *H01L 29/6653* (2013.01); *H01L 29/66787* (2013.01); *H01L 29/7827* (2013.01)

(58) Field of Classification Search
CPC combination set(s) only.
See application file for complete search history.

(56) References Cited

U.S. PATENT DOCUMENTS

| | | | |
|---|---|---|---|
| 5,637,898 A | 6/1997 | Baliga | |
| 7,148,541 B2 | 12/2006 | Park et al. | |
| 7,683,428 B2 | 3/2010 | Chidambarrao et al. | |
| 9,087,897 B1 | 7/2015 | Anderson et al. | |
| 9,299,835 B1 | 3/2016 | Anderson et al. | |
| 9,536,793 B1 | 1/2017 | Zhang et al. | |
| 2017/0236917 A1* | 8/2017 | Nowak | H01L 29/66545 |
| | | | 257/401 |
| 2017/0317210 A1* | 11/2017 | Anderson | H01L 29/0847 |

* cited by examiner

*Primary Examiner* — Trang Q Tran
(74) *Attorney, Agent, or Firm* — Gibb & Riley, LLC; Anthony J. Canale

(57) ABSTRACT

Disclosed are embodiments of an improved method for forming a vertical field effect transistor (VFET). In each of the embodiments of the method, a semiconductor fin is formed sufficiently thick (i.e., wide) so that the surface area of the top of the semiconductor fin is sufficiently large to facilitate epitaxial growth thereon of a semiconductor material for a second source/drain region. As a result, the second source/drain region will be sufficiently large to avoid potential contact-related defects (e.g., unlanded contacts, complete silicidation of second source/drain region during contact formation, etc.). Additionally, either before or after this second source/drain region is formed, at least the center portion of the semiconductor fin, which will include the channel region of the VFET, is thinned down to a desired critical dimension for optimal VFET performance. Also disclosed are VFET structure embodiments resulting from this method.

11 Claims, 13 Drawing Sheets

METHOD OF FORMING A VERTICAL FIELD EFFECT TRANSISTOR (VFET) AND A VFET STRUCTURE

BACKGROUND

Field of the Invention

The present invention relates to vertical field effect transistors (VFETs). More particularly, the present invention relates to an improved method of forming a VFET and the resulting VFET structure.

Description of the Related Art

Integrated circuit (IC) design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel. It should be noted that, because the semiconductor fin is so thin, any field effects exhibited at the top surface are insignificant (i.e., negligible).

Recently, vertical field effect transistors (VFETs) have been developed that allow for increased device density (i.e., a greater number of devices within a given area). A VFET device typically includes a first source/drain region in a substrate, a semiconductor fin that extends upward from the first source/drain region, and a second source/drain region that is epitaxially grown on the top surface of the semiconductor fin. A gate structure laterally surrounds the semiconductor fin and is electrically isolated from the first source/drain region and the second source/drain region by a lower and second spacer layers, respectively. However, with device size scaling, the thickness of semiconductor fins has decreased significantly (e.g., to less than 6 nm). Furthermore, processing techniques often result in tapered semiconductor fins where the upper portion is even thinner (e.g., less than 5 nm). Unfortunately, when the surface area of the top of a semiconductor fin is so small, epitaxially growing a sufficiently large second source/drain region for a VFET can be difficult and, if the size of the second source/drain region is too small, various contact-related defects (e.g., unlanded contacts, complete silicidation of second source/drain region during contact formation, etc.) can occur.

SUMMARY

In view of the foregoing, disclosed herein are embodiments of an improved method for forming a vertical field effect transistor (VFET). In each of the embodiments of the method, a semiconductor fin is formed sufficiently thick (i.e., wide) so that the surface area of the top of the semiconductor fin is sufficiently large to facilitate epitaxial growth thereon of a semiconductor layer for a second source/drain region. As a result, the second source/drain region will be sufficiently large to avoid potential contact-related defects (e.g., unlanded contacts, complete silicidation of second source/drain region during contact formation, etc.). Additionally, either before or after this second source/drain region is formed, at least the center portion of the semiconductor fin, which will include the channel region of the VFET, is thinned down to a desired critical dimension for optimal VFET performance. Also disclosed are VFET structure embodiments resulting from the above-described method.

More particularly, in one embodiment of the disclosed method for forming a vertical field effect transistor (VFET), a semiconductor fin can be formed on a semiconductor layer. The semiconductor fin can have a first portion, a second portion above the first portion and a third portion above the second portion. Either before or after the semiconductor fin is formed a first source/drain region can be formed such that the first portion of the semiconductor fin is immediately adjacent to the first source/drain region. At least the second portion of the semiconductor fin can be thinned relative to the third portion such that the third portion at the top of the semiconductor fin has a first thickness and such that the second portion at the center of the semiconductor fin and optionally the first portion at the bottom of the semiconductor fin have a second thickness that is less than the first thickness. Subsequently, a gate structure can be formed such that it is positioned laterally immediately adjacent to the second portion of the semiconductor fin, thereby defining a channel region within the second portion of the semiconductor fin. Specifically, this gate structure can be formed on a first spacer layer, which is above the semiconductor layer and, particularly, above the first source/drain region and positioned laterally immediately adjacent to the first portion of the semiconductor fin. Such a first spacer layer can be formed either after the above-mentioned thinning process such that the first portion and second portion of the semiconductor fin will have essentially the same second thickness. Alternatively, the first spacer layer can be formed before the above-mentioned thinning process such that the first portion of the semiconductor fin, like the third portion, remains thicker than the second portion of the semiconductor fin. Additionally, a second spacer layer can be formed above the gate structure and positioned laterally immediately adjacent to the third portion. After the second spacer layer is formed, semiconductor material can be epitaxially deposited onto the top of the semiconductor fin so as to form a second source/drain region.

In another embodiment of the disclosed method for forming a vertical field effect transistor (VFET), a semiconductor fin can similarly be formed on a semiconductor layer. The semiconductor fin can have a first portion, a second portion above the first portion and a third portion above the second portion. Either before or after the semiconductor fin is formed a first source/drain region can be formed such that the first portion of the semiconductor fin is immediately adjacent to the first source/drain region. Subsequently, a first spacer layer can be formed on the semiconductor layer and, particularly, above the first source/drain region and positioned laterally immediately adjacent to the first portion of the semiconductor fin. A first sacrificial layer can then be formed above the first spacer layer so that it is positioned laterally immediately adjacent to the second portion of the semiconductor fin. A second spacer layer can be formed above the first sacrificial layer and positioned laterally immediately adjacent to the semiconductor fin. After the second spacer layer is formed, semiconductor material can be epitaxially deposited onto the top of the semiconductor fin so as to form a second source/drain region. Subsequently, a protective cap and protective sidewall spacer can be formed on the second source/drain region and the first sacrificial layer can be selectively removed so as to expose the second portion of the semiconductor fin. Then, the second portion of the semiconductor fin can be thinned such that the third portion at the top of the semiconductor fin as well as the first portion at the bottom of the semiconductor fin have a first thickness and such that the second portion at the center of the semiconductor fin has a second thickness that is less than the first thickness. Once the second portion of the semiconductor fin is thinned, a gate structure can be formed above the first spacer layer, below the second spacer layer and positioned laterally immediately adjacent to the second portion of the semiconductor fin, thereby defining a channel region within the second portion of the semiconductor fin.

Also disclosed herein are embodiments of a vertical field effect transistor (VFET) structure formed according to the above-described method embodiments. Each of the embodiments of the disclosed VFET structure can include a first source/drain region, a second source/drain region and a semiconductor fin extending vertically between the first source/drain region and the second source/drain region.

The semiconductor fin can have: a first portion immediately adjacent to the first source/drain region; a second portion above the first portion and containing a channel region; and a third portion above the second portion and having a top immediately adjacent to the second source/drain region. Instead of having an essentially uniform thickness or even a tapered thickness from the first portion to the third portion, in the VFET structure disclosed herein the third portion of the semiconductor fin is thicker than the second portion and, optionally, thicker than the first portion.

The VFET structure can further include at least a first spacer layer, a gate structure, and a second spacer layer. The first spacer layer can be above the first source/drain region and positioned laterally immediately adjacent to the first portion of the semiconductor fin. The gate structure can be above the first spacer layer and positioned laterally immediately adjacent to the second portion of the semiconductor fin at the channel region. The second spacer layer can be above the gate structure and positioned laterally immediately adjacent to the third portion of the semiconductor fin.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, vertical field effect transistors (VFETs) have been developed that allow for increased device density (i.e., a greater number of devices within a given area). A VFET device typically includes a first source/drain region in a substrate, a semiconductor fin that extends upward from the first source/drain region, and a second source/drain region that is epitaxially grown on the top surface of the semiconductor fin. A gate structure laterally surrounds the semiconductor fin and is electrically isolated from the first source/drain region and the second source/drain region by a lower and second spacer layers, respectively. However, with device size scaling, the thickness of semiconductor fins has decreased significantly (e.g., to less than 6 nm). Furthermore, processing techniques often result in tapered semiconductor fins where the upper portion is even thinner (e.g., less than 5 nm). Unfortunately, when the surface area of the top of a semiconductor fin is so small, epitaxially growing a sufficiently large second source/drain region for a VFET can be difficult and, if the size of the second source/drain region is too small, various contact-related defects (e.g., unlanded contacts, complete silicidation of second source/drain region during contact formation, etc.) can occur.

In view of the foregoing, disclosed herein are embodiments of an improved method for forming a vertical field effect transistor (VFET). In each of the embodiments of the method, a semiconductor fin is formed sufficiently thick (i.e., wide) so that the surface area of the top of the semiconductor fin is sufficiently large to facilitate epitaxial growth thereon of a semiconductor layer for a second source/drain region. As a result, the second source/drain region will be sufficiently large to avoid potential contact-related defects (e.g., unlanded contacts, complete silicidation of second source/drain region during contact formation, etc.). Additionally, either before or after this second source/drain region is formed, at least the center portion of the semiconductor fin, which will include the channel region of the VFET, is thinned down to a desired critical dimension for optimal VFET performance. Also disclosed are VFET structure embodiments resulting from the above-described method.

Figure 1:
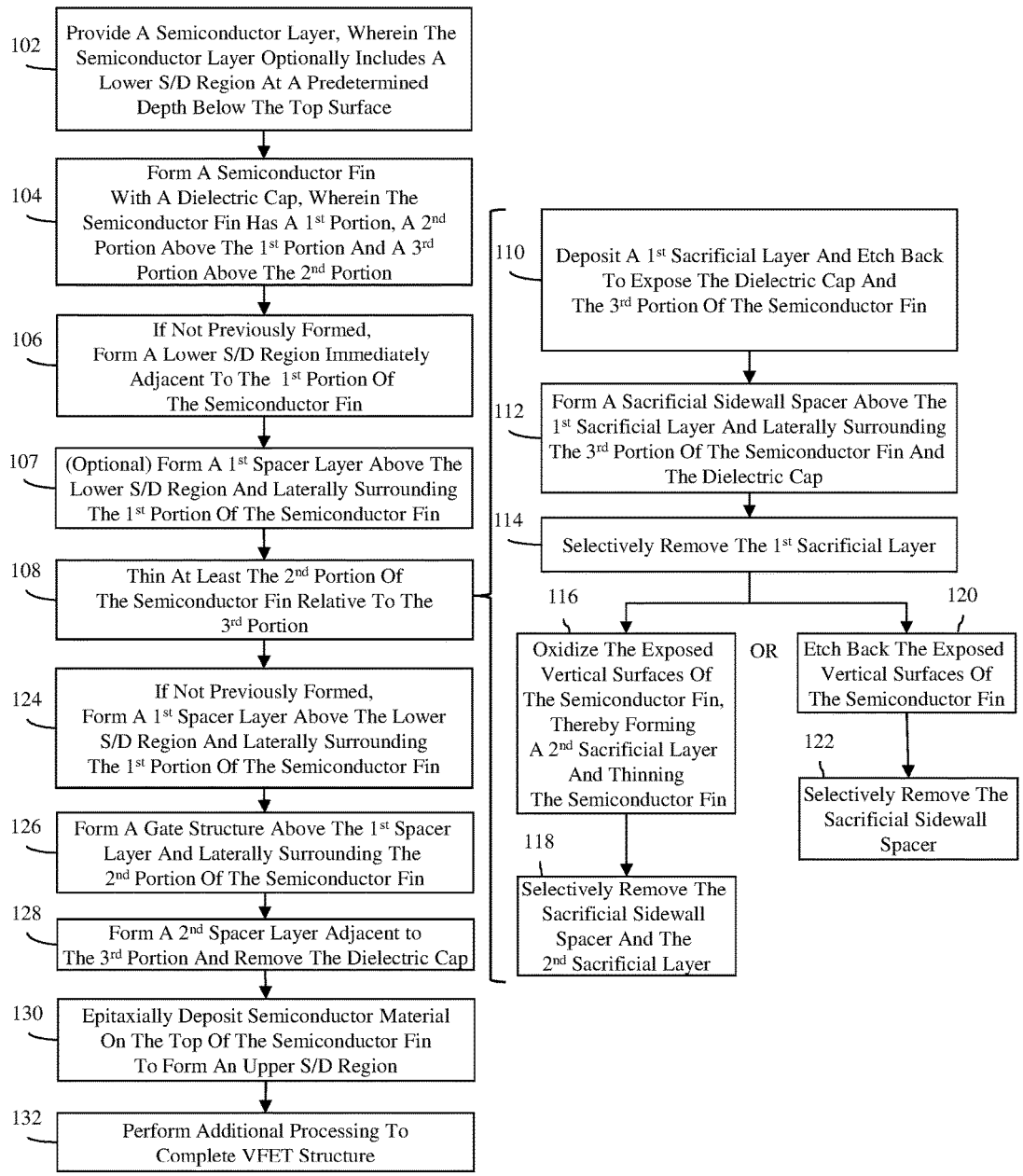
FIG. 1 is a flow diagram illustrating an embodiment of a method for forming a vertical field effect transistor (VFET)

More particularly, FIG. 1 is a flow diagram illustrating an embodiment of a method for forming the vertical field effect transistor (VFET) (e.g., see the VFET 200 shown in FIG. 15).

Figure 2:
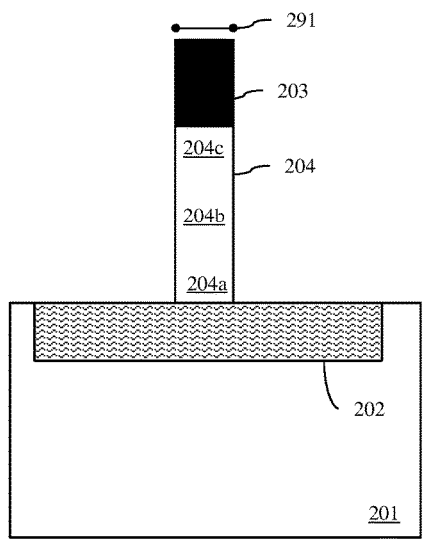
FIG. 2 is a cross-section diagram illustrating a partially completed VFET formed according to the method of FIG. 1.

In this embodiment, a semiconductor layer 201 can be provided (see process 102 and FIG. 2). The semiconductor layer 201 can be a bulk semiconductor wafer, such as a bulk silicon wafer, as illustrated. Alternatively, the semiconductor layer can be a semiconductor layer of a semiconductor-on-insulator wafer (e.g., a silicon layer of a silicon-on-insulator (SOI) wafer).

The semiconductor layer 201 can be undoped so that a channel region of the resulting VFET is undoped, enabling higher mobility. Alternatively, the semiconductor layer can be doped so as to have a first type conductivity at a relatively low conductivity level (e.g., P− conductivity in the case of an N-type VFET or N− conductivity in the case of a P-type VFET) and, thus, so that the channel region of the resulting VFET will also have the first type conductivity at the relatively low conductivity level.

Optionally, the semiconductor layer 201 can include a first source/drain region (not shown), which was previously formed to be located at some predetermined depth below the top surface of the semiconductor layer 201. The first source/drain region can have a second type conductivity at a relatively high conductivity level (e.g., N+ conductivity in the case of an N-type VFET or P+ conductivity in the case of a P-type VFETs). Such a first source/drain region could be formed, for example, by performing a masked dopant implantation process to form a deep well region below the top surface of the semiconductor layer 201. Alternatively, any other suitable technique could be used to form such a first source/drain region. For example, the semiconductor layer 201 can include multiple semiconductor layers and, particularly, a first semiconductor layer with a trench filled with an epitaxial semiconductor material (i.e., a first source/drain region) and a second semiconductor layer on the first semiconductor layer and extending laterally over the first source/drain region. The epitaxial semiconductor material of such a first source/drain region can be the same or different than that of the semiconductor layer.

Figure 3:
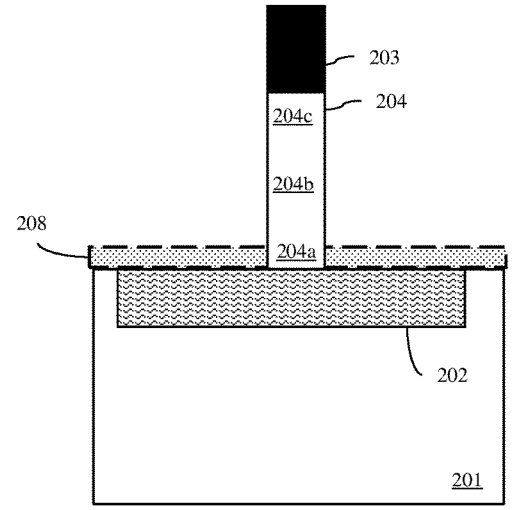
FIG. 3 is a cross-section diagram illustrating a partially completed VFET formed according to the method of FIG. 1 and including a first spacer layer optionally formed at process 107.

At least one semiconductor fin 204 (e.g., a silicon fin) with a dielectric cap 203 can be formed using the semiconductor layer 201 (e.g., etched into the semiconductor layer 201) (see process 104 and FIG. 3). For purposes of this disclosure, a semiconductor fin refers to a relatively tall and thin, elongated, semiconductor body that is essentially rectangular in shape. Techniques for forming semiconductor fins with dielectric caps including, for example, conventional lithographic patterning and etch techniques and sidewall image transfer (SIT) techniques, are well known in the art. Thus, the details of these techniques have been omitted form the specification in order to allow the reader to focus on the salient aspects of the disclosed method. In any case, the dielectric cap 203 will be a remaining portion of a hard mask layer), which was formed and patterned above the substrate and used as a mask during etching of the semiconductor fin 204. The hard mask layer and, thus, the dielectric cap 203 can be made of silicon nitride or any other suitable hard mask material. The semiconductor fin 204 will have a first portion 204a (i.e., a lowest portion), a second portion 204b (e.g., a center portion) above the first portion 204a, and a third portion 204c (i.e., a highest portion) above the second portion 204b. The semiconductor fin 204 can have a first thickness 291 (or width) that is essentially uniform from the first portion 204a to the third portion 204c, as illustrated. Alternatively, the semiconductor fin 204 may taper slightly from the first portion 204a to the third portion 204c and the third portion 204c will have the first thickness 291. This first thickness 291 can be, for example, at least 10 nm.

If a first source/drain region is not already present within the semiconductor layer 201, a first source/drain region 202 can now be formed so as to be immediately adjacent to the first portion 204a of the semiconductor fin (see process 106, see FIG. 3). For example, the first source/drain region 202 can be formed as a dopant implant region within the semiconductor layer immediately below the semiconductor fin, as a doped epitaxial semiconductor region, etc. Various different techniques for forming such a first source/drain region are well known in the art. Thus, the details of these techniques have been omitted from this specification in order to allow the reader to focus on the salient aspects of the disclosed method. In any case, as mentioned above, the first source/drain region can have a second type conductivity at a relatively high conductivity level (e.g., N+ conductivity in the case of an N-type VFET or P+ conductivity in the case of a P-type VFET).

Optionally, a first spacer layer 208 can be formed on the semiconductor layer 201 and, particularly, above the first source/drain region 202 and positioned laterally immediately adjacent to the first portion 204a of the semiconductor fin 204 (see process 107 and FIG. 3). For example, a first spacer layer 208 can be deposited and, optionally, polished and etched back such that the first spacer layer 208 is above and immediately adjacent to the first source/drain region 202 and further laterally surrounds and is immediately adjacent to only the first portion 204a of the semiconductor fin 204. The first spacer layer 208 can be, for example, a layer of a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the first spacer layer 208 is hydrogenated silicon oxycarbide (SiOCH). Alternatively, the first spacer layer 208 can be a layer of any other suitable dielectric material.

Subsequently, at least the second portion 204b of the semiconductor fin 204 can be thinned relative to the third portion 204c such that the third portion 204c at the top of the semiconductor fin 204 retains the first thickness 291 and such that the first and second portions 204a-204b at the bottom and center, respectively, of the semiconductor fin 204 have a second thickness that is less than the first thickness 291 (see process 108). For example, to thin the second portion 204b of the semiconductor fin 204 relative to the third portion 204c, the following processes can be performed. It should be noted that, if the first spacer layer 208 was previously formed at process 107, only the second portion 204b of the semiconductor fin 204 will be thinned using the processes described below. However, if the first spacer layer 208 was not previously formed at process 107, the first portion 204a and the second portion 204b of the semiconductor fin 204 will be thinned using the processes described below.

Figure 4:
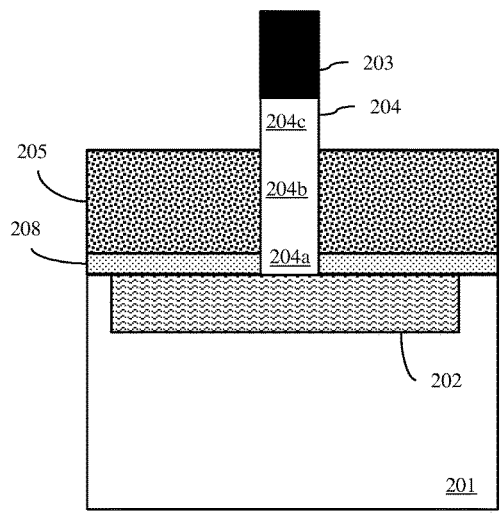
FIG. 4 is a cross-section diagram illustrating a partially completed VFET formed according to the flow diagram of FIG. 1 and including a first spacer layer optionally formed at process 107.

Specifically, a first sacrificial layer 205 can be formed so as to laterally surround and be positioned immediately adjacent to the second portion 204b of the semiconductor fin 204, as illustrated (see process 110 and FIG. 4). For example, an amorphous carbon layer or a blanket layer of some other suitable sacrificial material can be deposited (e.g., using a spin-on deposition process or some other suitable deposition process) over the partially completed structure such that it covers the semiconductor fin 204 and dielectric cap 203 thereon. This first sacrificial layer 205 can, optionally, be polished (e.g., using a chemical mechanical polishing (CMP) process) to expose the dielectric cap 203 and then etched back (i.e., recessed) to expose vertical surfaces of the dielectric cap 203 and the third portion 204c of the semiconductor fin 204. It should be noted that, if the first spacer layer 208 was previously formed at process 107, this first sacrificial layer 205 will be formed above and immediately adjacent to the first spacer layer 208 and will laterally surround and be positioned immediately adjacent to only the second portion 204b of the semiconductor fin 204, as illustrated. However, if the first spacer layer 208 was not previously formed at process 107, this first sacrificial layer 205 will be formed above and immediately adjacent to the first source/drain region 202 and will surround and be positioned immediately adjacent to both the first portion 204a and the second portion of the semiconductor fin 204 (not shown). In any case, the third portion 204c of the semiconductor fin 204, which extends vertically above the level of the top surface of the first sacrificial layer 205, should encompass at least the upper $\frac{1}{10}^{th}$ of the semiconductor fin 204 (e.g., the upper 10%, the upper 20%, the upper 30%, etc.), but no more than the upper $\frac{1}{2}$ of the semiconductor fin 204.

Figure 5:
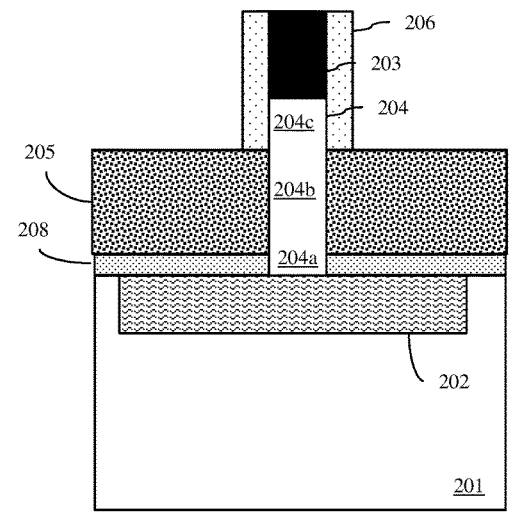
FIG. 5 is a cross-section diagram illustrating a partially completed VFET formed according to the method of FIG. 1 and including a first spacer layer optionally formed at process 107.

Next, a sacrificial sidewall spacer 206 can be formed above the first sacrificial layer 205 and positioned laterally immediately adjacent the exposed vertical surfaces of the dielectric cap 203 and the third portion 204c of the semiconductor fin 204 (see process 112 and FIG. 5). The sacrificial sidewall spacer 206 can be formed, for example, using conventional sidewall spacer formation techniques. That is, a relatively thin conformal sacrificial spacer layer can be deposited over the partially completed structure. A directional etch process can then be performed in order to remove horizontal portions of the sacrificial spacer layer from horizontal surfaces, leaving vertical portions of the sacrificial spacer layer intact and thereby forming a sacrificial sidewall spacer 206 that laterally surrounds and is immediately adjacent to the third portion 204c of the semiconductor fin 204 and the dielectric cap 203 thereon. The sacrificial sidewall spacer 206 formed at process 112 can be, for example, a sacrificial silicon dioxide sidewall spacer 206. Alternatively, the sacrificial sidewall spacer 206 can be made of any other suitable sacrificial material that is different from the material used for the dielectric cap 203 and the first sacrificial layer 205.

Figure 6A:
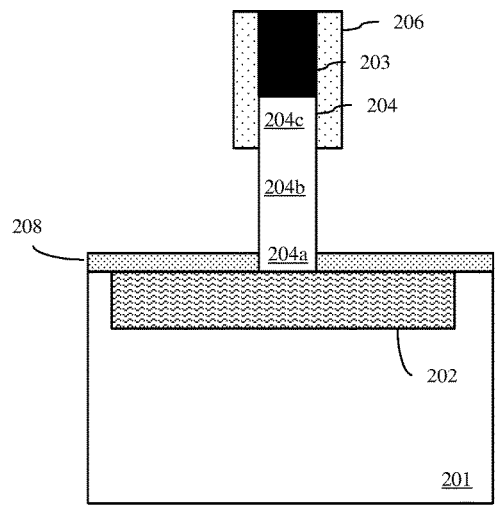
FIG. 6A is a cross-section diagram illustrating a partially completed VFET formed according to the method of FIG. 1 and including a first spacer layer optionally formed at process 107.
Figure 6B:
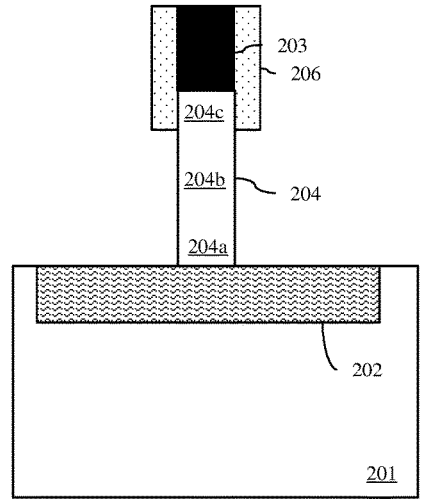
FIG. 6B is a cross-section diagram illustrating an alternative partially completed VFET formed according to the method of FIG. 1 without a first spacer layer at process 107.

After the sacrificial sidewall spacer 206 is formed, the first sacrificial layer 205 can be selectively removed, thereby exposing vertical surfaces of the semiconductor fin 204 below the third portion 204c (i.e., vertical surfaces of the first and second portions 204a-204b of the semiconductor fin 204) (see process 114). It should be noted that, if the first spacer layer 208 was previously formed at process 107, vertical surfaces of the second portion 204b only would be exposed by selective removal of the first sacrificial layer 205 at process 114 (see FIG. 6A). However, if the first spacer layer 208 was not previously formed at process 107, vertical surfaces of both the first portion 204a and the second portion 204b would be exposed by selective removal of the first sacrificial layer 205 at process 114 (see FIG. 6B). In any case, removal of the first sacrificial layer 205 can be performed using an isotropic etch process that is selective to the material of the first sacrificial layer 205 over the materials of the dielectric cap 203, semiconductor fin 204, semiconductor layer 201, first source/drain region 202 and sacrificial sidewall spacer 206. For example, if the first sacrificial layer 205 is an amorphous carbon layer, this layer can be selectively removed at process 114 using an oxygen ($O_2$) plasma etch process or some other suitable etch process.

Next, at least the second portion 204b of the semiconductor fin 204 can be thinned relative to the third portion 204c, which continues to be protected by the sacrificial sidewall spacer 206 and the dielectric cap 203, as discussed below. Any number of various different techniques could be performed in order to accomplish this thinning process.

Figure 7A:
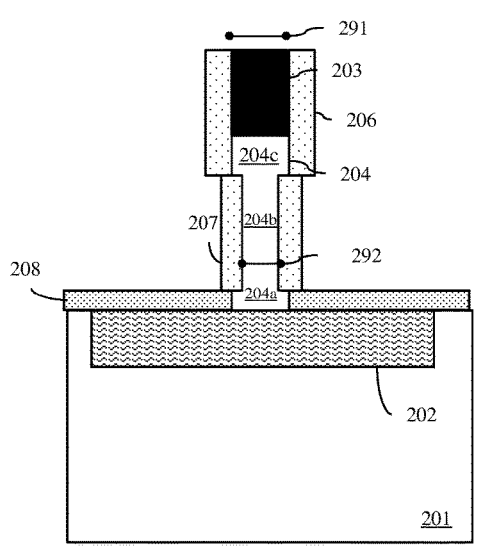
FIG. 7A is a cross-section diagram illustrating a partially completed VFET formed according to the method of FIG. 1 and including a first spacer layer optionally formed at process 107.
Figure 7B:
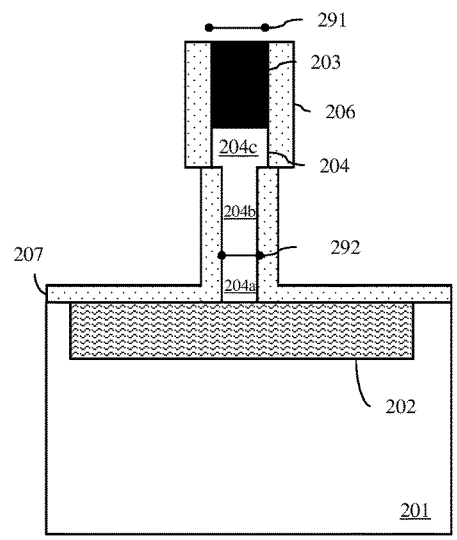
FIG. 7B is a cross-section diagram illustrating an alternative partially completed VFET formed according to the method of FIG. 1 without a first spacer layer at process 107.

For example, exposed vertical surfaces of the first portion 204a (if applicable) and the second portion 204b can be oxidized using an oxidation process that consumes some of the semiconductor material of the semiconductor fin 204 at the exposed vertical surfaces, effectively thinning the semiconductor fin 204 and forming a second sacrificial layer 207 and, particularly, a sacrificial silicon dioxide layer thereon (see process 116). It should be noted that, if the first spacer layer 208 was previously formed at process 107, vertical surfaces of second portion 204b only are exposed and oxidized at process 116 (see FIG. 7A). As a result, the second portion 204b will have a second thickness 292, which is less than the first thickness 291 of the third portion 204c and also less than the thickness of the first portion 204a. However, if the first spacer layer 208 was not previously formed at process 107, vertical surfaces of both the first portion 204a and the second portion 204b will be exposed and oxidized (see FIG. 7B). As a result, the first and second portions 204a-204b will have a second thickness 292 that is less than the first thickness 291 of the third portion 204c. In this case, the top surface of the semiconductor layer 201 and first source/drain region 202 will also be exposed and oxidized, thereby also thinning the semiconductor layer 201 (not shown). In any case, the second thickness 292 of the second portion 204b of the semiconductor fin 204 can be, for example, less than 6 nm (e.g., 5 nm).

Figure 8A:
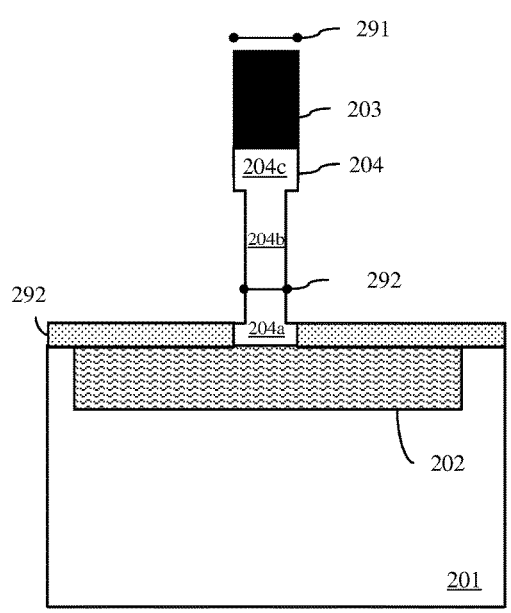
FIG. 8A is a cross-section diagram illustrating a partially completed VFET formed according to the method of FIG. 1 and including a first spacer layer optionally formed at process 107.
Figure 8B:
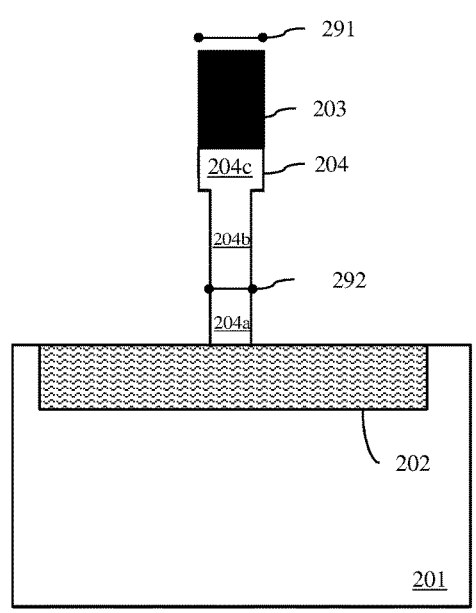
FIG. 8B is a cross-section diagram illustrating an alternative partially completed VFET formed according to the method of FIG. 1 without a first spacer layer at process 107.

Following process 116, the second sacrificial layer 207 and the sacrificial sidewall spacer 206 can be selectively removed, thereby exposing at least vertical surfaces of the dielectric cap 203 and the second and third portions 204b-204c of the semiconductor fin 204 (see process 118). For example, if both the second sacrificial layer 207 and the sacrificial sidewall spacer 206 are made of silicon dioxide, then the same selective isotropic etch process can be used to remove both of these sacrificial features. For example, a diluted hydrofluoric acid (DHF) wet etch process can be used to remove both the second sacrificial layer and the sacrificial sidewall spacer 206. Alternatively, the sacrificial sidewall spacer 206 and the second sacrificial layer 207 can be removed using separate selective isotropic etch processes. It should be noted that, if the first spacer layer 208 was previously formed at process 107, this first spacer layer 208 will remain intact following selective removal of the second sacrificial layer 207 at process 118 such that vertical surfaces of the first portion 204a of the semiconductor fin 204 remain protected (see FIG. 8A). However, if the first spacer layer 208 was not previously formed at process 107 above, removal of the second sacrificial layer 207 will also expose the top surface of the semiconductor layer 201 and the first source/drain region 202 as well as vertical surfaces of the first portion 204a (see FIG. 8B).

Alternatively, any other suitable techniques could be used to thin at least the second portion 204b of the semiconductor fin 204 relative to the third portion 204c (see process 120). For example, a selective isotropic etch process that is selective to silicon over the dielectric materials of the sacrificial sidewall spacer 206 and dielectric cap 203 can be performed. This selective isotropic etch process can be, for example, a hydrogen plasma etch process, a hot ammonia ($NH_3$) wet etch process, a tetramethylammonium hydroxide (TMAH) wet etch process or any other suitable etch process. Then, the sacrificial sidewall spacer 206 can be selectively removed (see process 122).

Next, if not previously formed at process 107, a first spacer layer 208 can be formed on the semiconductor layer 201 and, particularly, above the first source/drain region 202 and positioned laterally immediately adjacent to the first portion 204a of the semiconductor fin 204 (see process 124). For example, a first spacer layer 208 can be deposited and, optionally, polished and etched back such that the first spacer layer 208 is above the first source/drain region 202 and laterally surrounds and is immediately adjacent to only the first portion 204a of the semiconductor fin 204. The first spacer layer 208 can be, for example, a layer of a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the first spacer layer 208 is hydrogenated silicon oxycarbide (SiOCH). Alternatively, the first spacer layer 208 can be a layer of any other suitable dielectric material.

Figure 9:
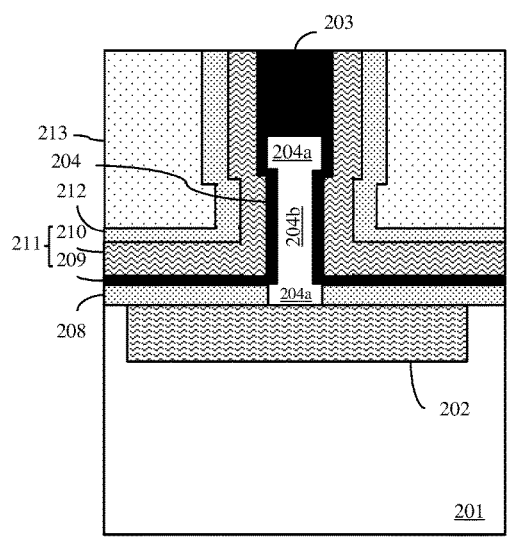
FIG. 9 is a cross-section diagram illustrating a partially completed VFET formed according to the method of FIG. 1.
Figure 10:
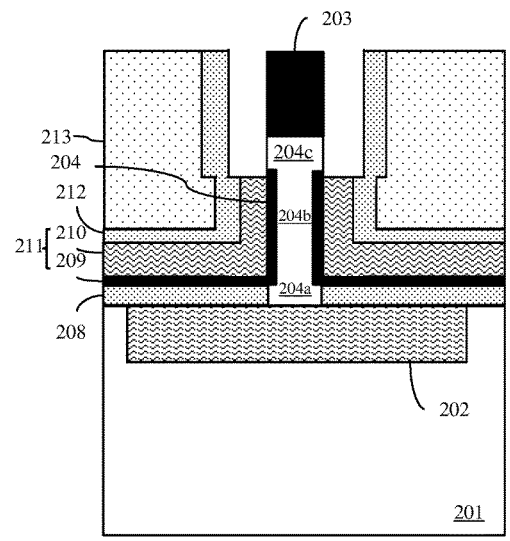
FIG. 10 is a cross-section diagram illustrating a partially completed VFET formed according to the method of FIG. 1.

Then, a gate structure 211 can be formed above the first spacer layer 208 immediately adjacent to and laterally surrounding only the second portion 204b of the semiconductor fin 204, thereby defining a channel region within the second portion 204b of the semiconductor fin 204 (see process 126 and FIGS. 9-10). For purposes of illustration, the remaining processes described below are illustrated in the Figures with respect to the partially completed structure shown in FIG. 8A, wherein the first portion 204a of the semiconductor fin 204 is wider than the second portion 204b. However, it should be understood that the Figures are not intended to be limiting and that, alternatively, the remaining processes could be performed with respect to the partially completed structure shown in FIG. 8B, following formation of a first spacer layer at process 124.

To form the gate structure 211, multiple layers can be deposited above the first spacer layer 208 and over the semiconductor fin 204, as shown in FIG. 9.

Specifically, a gate dielectric layer 209 can be conformally deposited over the partially completed structure (i.e., on the top surface of the first spacer layer 208 and extending over the semiconductor fin 204 with the dielectric cap 203). The gate dielectric layer 209 can be made, for example, of silicon dioxide or a high-K gate dielectric material. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Techniques for conformally depositing such gate dielectric materials are well known in the art and, thus, the details have been omitted from this specification in order to allow the reader to focus on the salient aspects of the disclosed methods.

At least one gate conductor layer 210 can be conformally deposited onto the gate dielectric layer 209. The gate conductor layer 210 can be made, for example, of doped polysilicon. Alternatively, the gate conductor layer 210 can be made of a conformal work function metal immediately adjacent to the gate dielectric layer 209 and, optionally, a fill metal on the work function metal. It should be noted that the metal or metal alloy material of such a work function metal can be preselected in order to achieve the optimal gate conductor work function given the conductivity type of the VFET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten, aluminum and cobalt.

An additional conformal dielectric layer 212 can be deposited on the gate conductor layer 210 and an interlayer dielectric (ILD) layer 213 can be deposited onto the conformal dielectric layer 212. The additional conformal dielectric layer 212 can be made, for example, of the same dielectric material used for the first spacer layer 208 and can be different from the ILD material of the ILD layer 213. For example, the additional conformal dielectric layer 212 can be made of hydrogenated silicon oxycarbide (SiCOH) and the ILD layer 213 can be made of silicon dioxide, borophosphosilicate glass (BPSG), tetraethyl orthosilicate (TEOS), fluorinated tetraethyl orthosilicate (FTEOS), etc.

Next, a polishing process (e.g., a CMP polishing process) can be performed in order to expose the top surface of the dielectric cap 203 and the gate conductor layer 210 can be recessed (e.g., below the level of the third portion 204c) in order to selectively adjust the length of the gate structure 211 (see FIG. 10). It should be noted that, depending upon the selective etch process used to recess the gate conductor layer 210, the gate dielectric layer 209 may also be recessed, as illustrated.

Figure 11:
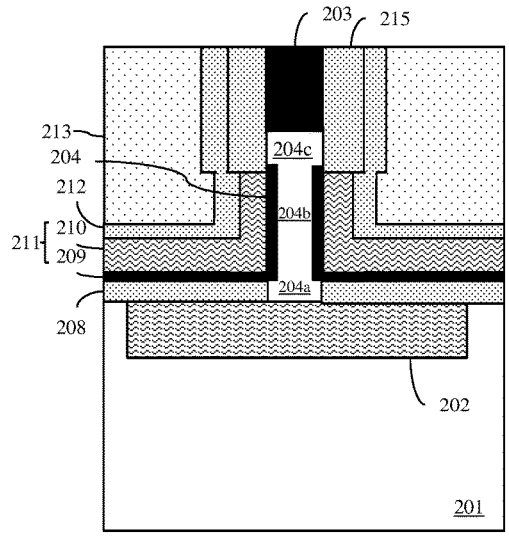
FIG. 11 is a cross-section diagram illustrating a partially completed VFET formed according to the method of FIG. 1.
Figure 12:
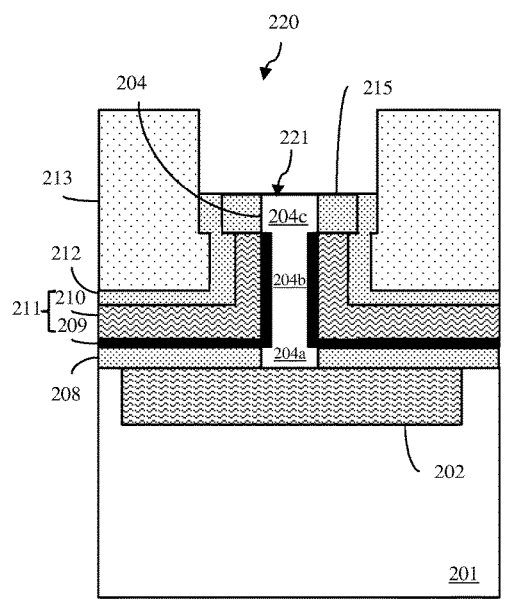
FIG. 12 is a cross-section diagram illustrating a partially completed VFET formed according to the method of FIG. 1.

Once the gate structure 211 is formed and the length of the gate structure 211 is selectively adjusted, a second spacer layer 215 can be formed above and immediately adjacent to the gate conductor layer 210 and further laterally surrounding and immediately adjacent to the third portion 204c of the semiconductor fin 204 (see process 128 and FIGS. 11-12). For example, a second spacer layer 215 can be deposited into the trench, which was previously formed adjacent to the third portion 204c by recessing the gate conductor layer 210 at process 126. This second spacer layer 215 can, for example, be made of the same dielectric material as that used for the first spacer layer 208 and/or for the additional conformal dielectric layer 212. Then, a polishing process (e.g., a CMP process) can be performed to again expose the top surface of the dielectric cap 203 (see FIG. 11). Next, at least one additional selective etch process can be performed in order to recess the second spacer layer 215 and the additional conformal dielectric layer 212 and to also remove the dielectric cap 203, thereby exposing the top 221 of the semiconductor fin 204 and creating, within the ILD layer 213, an opening 220 that is wider than the third portion 204c of the semiconductor fin 204 (see FIG. 12).

Figure 13:
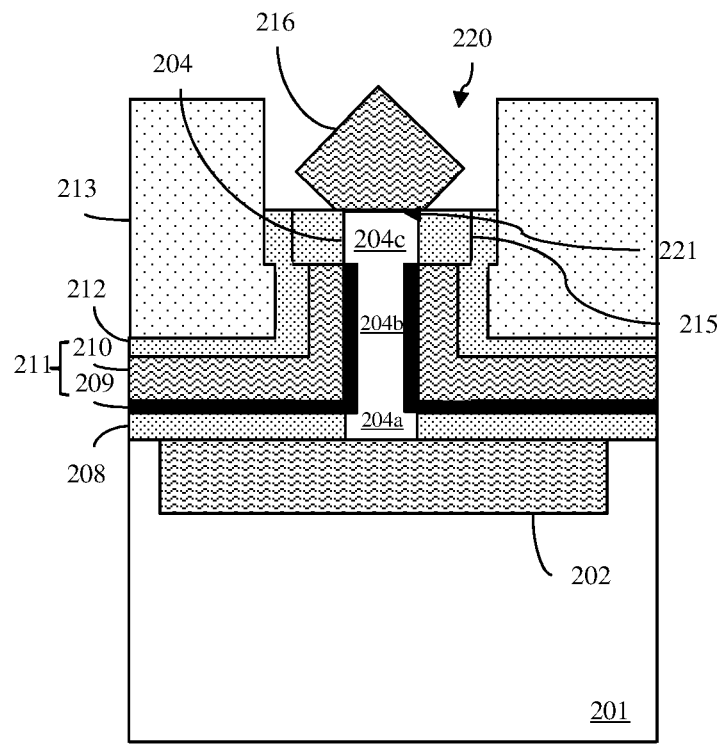
FIG. 13 is a cross-section diagram illustrating a partially completed VFET formed according to the method of FIG. 1.

Semiconductor material can then be epitaxially deposited onto the top 221 of the semiconductor fin 204 so as to form a second source/drain region 216 (see process 130 and FIG. 13). The epitaxial semiconductor material of the second source/drain region 216 can be in situ doped during deposition so that it has a second type conductivity at a relatively high conductivity level (e.g., N+ conductivity in the case of an N-type VFET or P+ conductivity in the case of a P-type VFET). Additionally, the epitaxial semiconductor material of the second source/drain region 216 and, optionally, the first source/drain region 202 (e.g., when the first source/drain region is formed as a semiconductor-filled trench) can be the same semiconductor material as that used for the semiconductor fin 204 (e.g., silicon). Alternatively, this epitaxial semiconductor material can be preselected to optimize performance depending upon the conductivity type of the VFET being formed. For example, for a P-type VFET, epitaxial semiconductor material of the upper and/or first source/drain regions can be silicon germanium (SiGe) in order to enhance majority charge carrier mobility within the P-type VFET's channel region and, thereby enhance performance. For an N-type VFET, the epitaxial semiconductor material of the upper and/or first source/drain regions can be silicon carbide (SiC), which will enhance majority charge carrier mobility within the N-type VFET's channel region and, thereby enhance performance. It should be noted that the first thickness 291 of the third portion 204c of the semiconductor fin 204 ensures that the surface area at the top of the semiconductor fin 204 is sufficiently large to enhance epitaxial growth of the semiconductor material such that the resulting second source/drain region 216 is relatively large. For example, as illustrated, the resulting second source/drain region 216 can have a large diamond shape with opposing sides that extend laterally over the second spacer layer 215.

Figure 14:
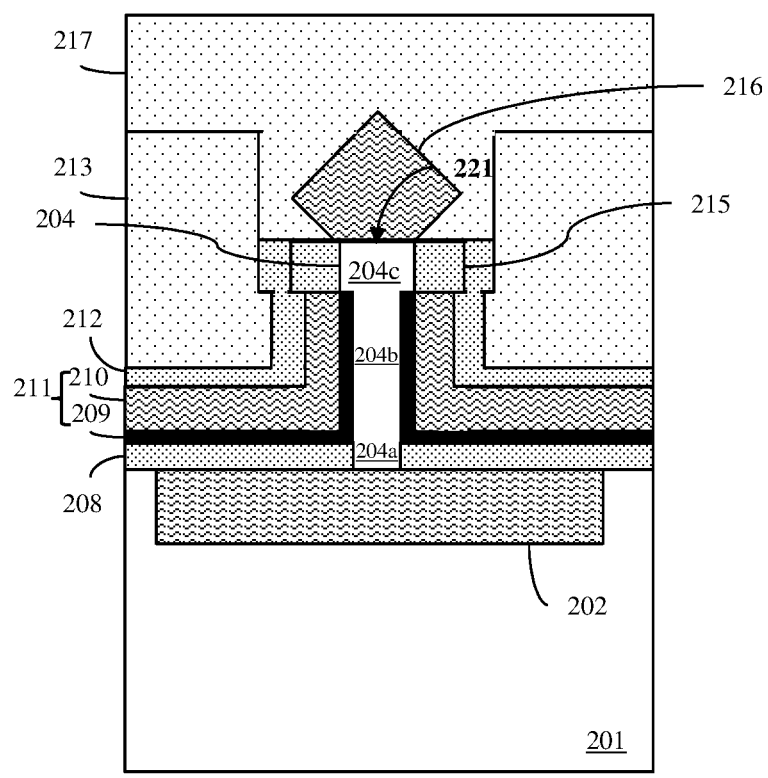
FIG. 14 is a cross-section diagram illustrating a partially completed VFET formed according to the method of FIG. 1.
Figure 15A:
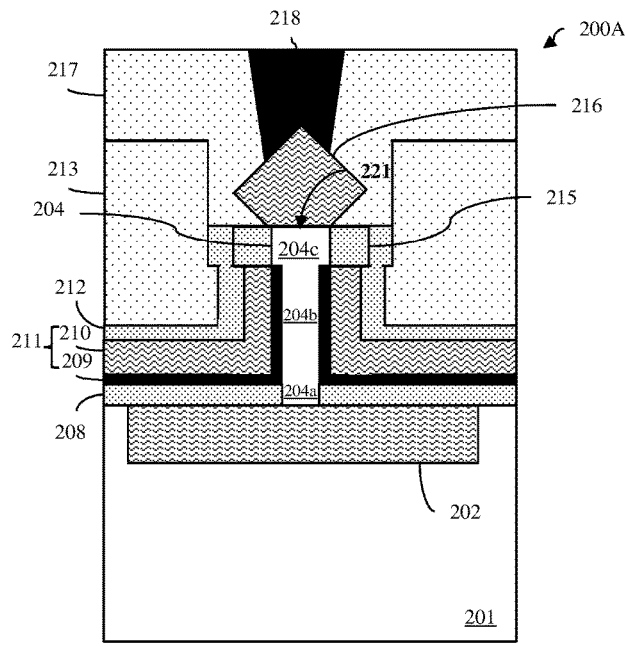
FIG. 15A is a cross-section diagram illustrating a VFET formed according to the method of FIG. 1 and including a first spacer layer formed at process 107.
Figure 15B:
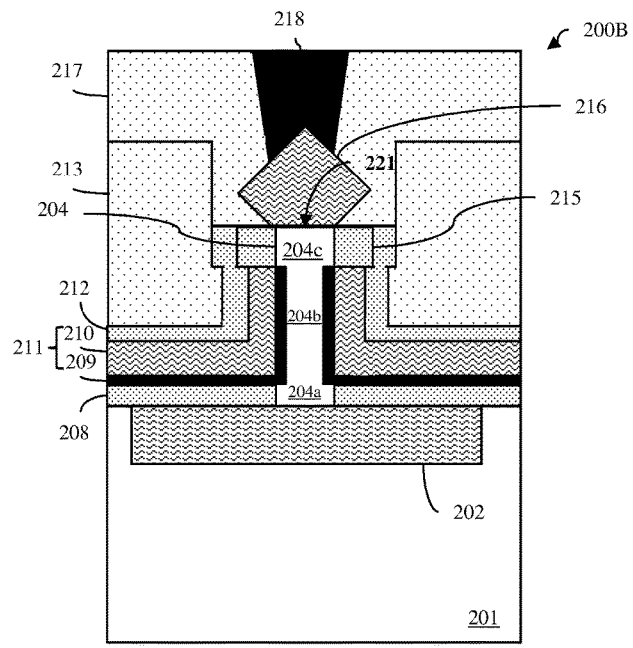
FIG. 15B is a cross-section diagram illustrating an alternative VFET formed according to the method of FIG. 1 and including a first spacer layer formed at process 124 (as opposed to process 107)

Once the second source/drain region 216 is formed, additional processing can be performed in order to complete the VFET 200 (see process 132). The additional processing can include, for example, deposition of an additional ILD layer 217 to cover the ILD layer 213 and to fill any remaining space in the opening 220 above the second spacer layer 215 and the additional conformal dielectric layer 212 and further around and above the second source/drain region 216 (see FIG. 14); formation of middle of the line (MOL) contacts (e.g., see contact 218 to the second source/drain region 216) (see FIG. 15A or 15B); performance of back end of the line (BEOL) processing, etc. FIG. 15A is a cross-section drawing illustrating a VFET 200A formed according to the method of FIG. 1 and, particularly, with a first spacer layer 208 at process 107 such that the second portion 204b of the semiconductor fin 204 is thinner than both the first portion 204a and the third portion 204c. FIG. 15B is a cross-section drawing illustrating alternative VFET 200B formed according to the method of FIG. 1 and, particularly, with the first spacer layer 208 at process 124 such that both the first portion 204a and the second portion 204b of the semiconductor fin 204 are thinner than the third portion 204c. In any case, since the second source/drain region 216 is relatively large due to the relatively large thickness of the third portion 204c of the semiconductor fin 204, issues that could occur during formation of the contact 218 to the second source/drain region 216 are avoided. As mentioned above, these issues include an unlanded contact, complete silicidation of the second source/drain region during contact formation, etc.

It should be noted that, for illustration purposes, this embodiment of the method is described above and illustrated in the drawings with respect to a VFET having a single semiconductor fin. However, it should be understood that the description and drawings are not intended to be limiting. Alternatively, the VFET 200 can be formed so as to incorporate multiple semiconductor fins for increased drive current. In this case, the first and second portions of each semiconductor fin would be thinned as described above and a gate structure would be formed so as to laterally surround the second portions of all of the semiconductor fins.

Figure 16:
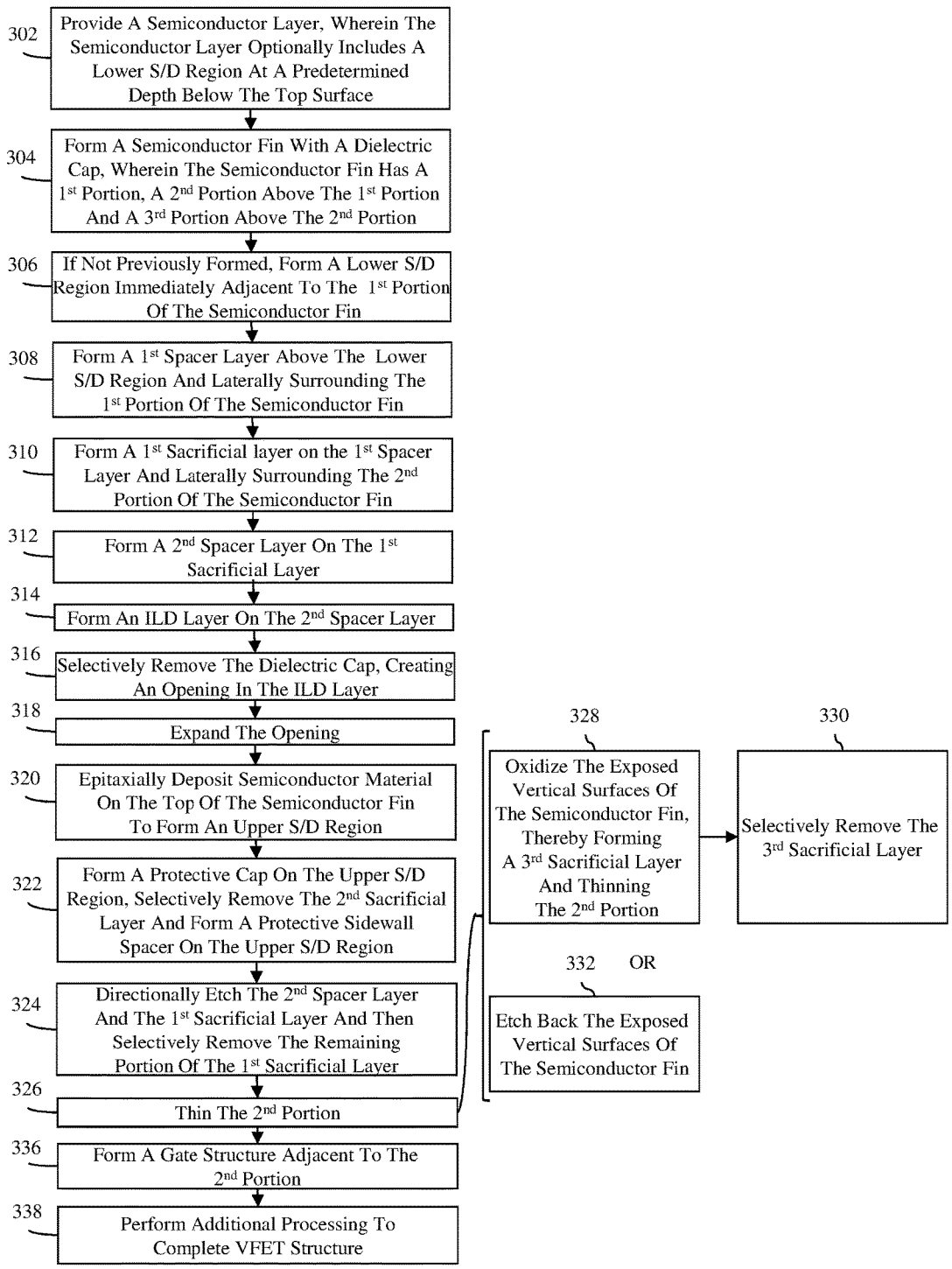
FIG. 16 is a flow diagram illustrating another embodiment of a method for forming a vertical field effect transistor (VFET)
Figures 32, 33:
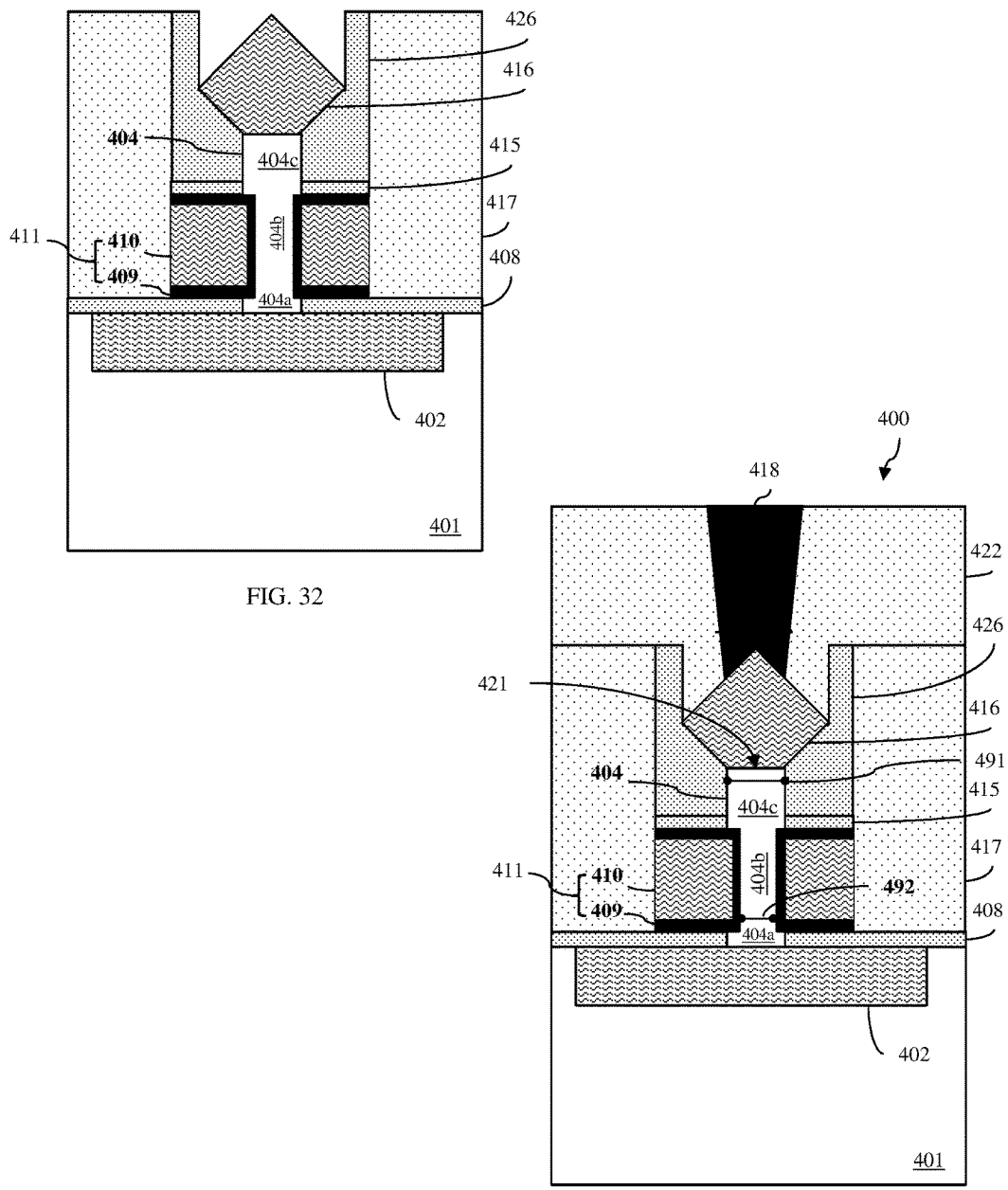
FIG. 32 is a cross-section diagram illustrating a partially completed VFET formed according to the method of FIG. 16.
FIG. 33 is a cross-section diagram illustrating a VFET formed according to the method of FIG. 16.

FIG. 16 is a flow diagram illustrating another embodiment of a method for forming a vertical field effect transistor (VFET) (e.g., see the VFET 400 shown in FIG. 33).

Figure 17:
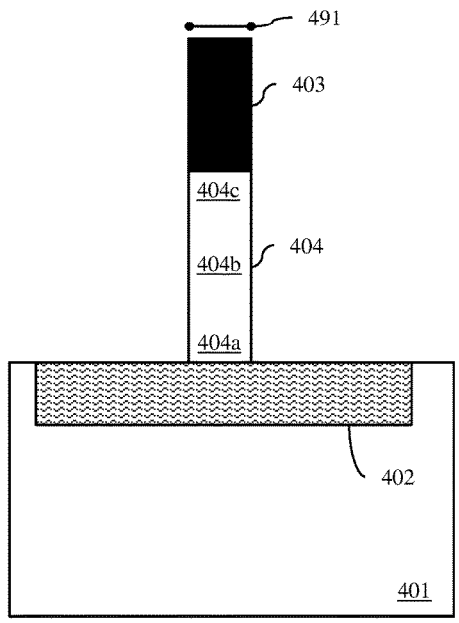
FIG. 17 is a cross-section diagram illustrating a partially completed VFET formed according to the method of FIG. 16.

As with the previously described embodiment, in this embodiment, a semiconductor layer 401 can be provided (see process 302 and FIG. 17). The semiconductor layer 401 can be a bulk semiconductor wafer, such as a bulk silicon wafer, as illustrated. Alternatively, the semiconductor layer can be a semiconductor layer of a semiconductor-on-insulator wafer (e.g., a silicon layer of a silicon-on-insulator (SOI) wafer).

The semiconductor layer 401 can be undoped so that a channel region of the resulting VFET is undoped, enabling higher mobility. Alternatively, the semiconductor layer can be doped so as to have a first type conductivity at a relatively low conductivity level (e.g., P− conductivity in the case of an N-type VFET or N− conductivity in the case of a P-type VFET) and, thus, so that the channel region of the resulting VFET will also have the first type conductivity at the relatively low conductivity level.

Optionally, the semiconductor layer 401 can include a first source/drain region (not shown), which was previously formed to be located at some predetermined depth below the top surface of the semiconductor layer 401. The first source/drain region can have a second type conductivity at a relatively high conductivity level (e.g., N+ conductivity in the case of an N-type VFET or P+ conductivity in the case of a P-type VFETs). Such a first source/drain region 402 could be formed, for example, by performing a masked dopant implantation process to form a deep well region below the top surface of the semiconductor layer 401. Alternatively, any other suitable technique could be used to form such a first source/drain region. For example, the semiconductor layer 401 can include multiple semiconductor layers and, particularly, a first semiconductor layer with a trench filled with an epitaxial semiconductor material (i.e., a first source/drain region) and a second semiconductor layer on the first semiconductor layer and extending laterally over the first source/drain region. The epitaxial semiconductor material of such a first source/drain region can be the same or different than that of the semiconductor layer.

At least one semiconductor fin 404 with a dielectric cap 403 can be formed using the semiconductor layer 401 (e.g., etched into semiconductor layer 401) (see process 304 and FIG. 17). For purposes of this disclosure, a semiconductor fin refers to a relatively tall and thin, elongated, semiconductor body that is essentially rectangular in shape. Techniques for forming semiconductor fins with dielectric caps including, for example, conventional lithographic patterning and etch techniques and sidewall image transfer (SIT) techniques, are well known in the art. Thus, the details of these techniques have been omitted form the specification in order to allow the reader to focus on the salient aspects of the disclosed method. In any case, the dielectric cap 403 will be a remaining portion of a hard mask layer, which was formed and patterned above the substrate and used as a mask during etching of the semiconductor fin 404. The hard mask layer and, thus, the dielectric cap 403 can be made of silicon nitride or any other suitable hard mask material. The semiconductor fin 404 will have a first portion 404*a* (i.e., a lowest portion), a second portion 404*b* (e.g., a center portion) above the first portion 404*a*, and a third portion 404*c* (i.e., a highest portion) above the second portion 404*b*. The semiconductor fin 404 can have a first thickness 491 (or width) that is essentially uniform from the first portion 404*a* to the third portion 404*c*, as illustrated. Alternatively, the semiconductor fin 404 may taper slightly from the first portion 404*a* to the third portion 404*c* and the third portion 404*c* will have the first thickness 491. This first thickness 491 can be, for example, at least 10 nm.

If a first source/drain region is not present within the semiconductor layer 401, a first source/drain region 402 can now be formed so as to be immediately adjacent to the first portion 404*a* of the semiconductor fin (see process 306, see FIG. 17). For example, the first source/drain region 402 can be formed as a dopant implant region within the semiconductor layer immediately below the semiconductor fin, as a doped epitaxial semiconductor region, etc. Various different techniques for forming such a first source/drain region are well known in the art. Thus, the details of these techniques have been omitted from this specification in order to allow the reader to focus on the salient aspects of the disclosed method. In any case, as mentioned above, the first source/drain region can have a second type conductivity at a relatively high conductivity level (e.g., N+ conductivity in the case of an N-type VFET or P+ conductivity in the case of a P-type VFET).

Figure 18:
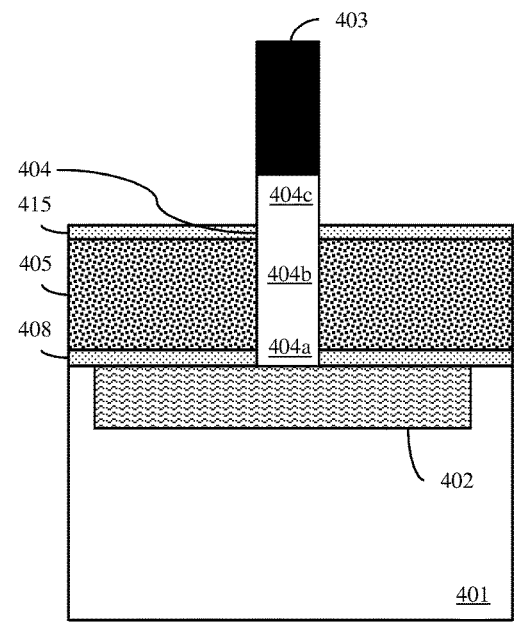
FIG. 18 is a cross-section diagram illustrating a partially completed VFET formed according to the method of FIG. 16.

A first spacer layer 408 can then be formed on the semiconductor layer 401 and, particularly, above the first source/drain region 402 laterally surrounding and immediately adjacent to the first portion 404*a* of the semiconductor fin 404 (see process 308 and FIG. 18). For example, a first spacer layer 408 can be deposited and, optionally, polished and etched back such that the first spacer layer 408 is above the first source/drain region 402 and laterally surrounds only the first portion 404*a* of the semiconductor fin 404. The first spacer layer 208 can be, for example, a layer of a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the first spacer layer 208 is hydrogenated silicon oxycarbide (SiOCH). Alternatively, the first spacer layer 208 can be a layer of any other suitable dielectric material.

A first sacrificial layer 405 can be formed above the first spacer layer 408 laterally surrounding and immediately adjacent to the second portion 404*b* of the semiconductor fin 404 (see process 310 and FIG. 18). For example, an amorphous carbon layer or a blanket layer of some other suitable sacrificial material can be deposited (e.g., using a spin-on deposition process or some other suitable deposition process) over the partially completed structure. This first sacrificial layer 405 can be polished (e.g., using a chemical mechanical polishing (CMP) process) to expose the dielectric cap 403 and then etched back (i.e., recessed) to expose vertical surfaces of the dielectric cap 203 and the third portion 404*c* of the semiconductor fin 404. Thus, the resulting first sacrificial layer 405 will be above the first spacer layer 408 and will laterally surround only the second portion 404*b* of the semiconductor fin 404. It should be noted that the third portion 404*c* of the semiconductor fin 404, which extends vertically above the level of the top surface of the first sacrificial layer 405, should encompass at least the upper $1/10^{th}$ of the semiconductor fin 404 (e.g., the upper 10%, the upper 20%, the upper 30%, etc.), but no more than the upper ½ of the semiconductor fin 404.

A second spacer layer 415 can be formed above the gate conductor layer 410 laterally surrounding and immediately adjacent to only a lower region of the third portion 404c of the semiconductor fin 404 (see process 312 and FIG. 18). For example, a second spacer layer 415 can be deposited and, optionally, polished and etched back such that the second spacer layer 415 is above the first sacrificial layer 405 and laterally surrounds only the lower region of the third portion 404c of the semiconductor fin 404. The second spacer layer 415 can, for example, be made of a low-K dielectric material, such as hydrogenated silicon oxycarbide (SiOCH), or alternatively, any other suitable dielectric material. Optionally, the second spacer layer 415 can be made of the same dielectric material as the first spacer layer 408.

Figure 19:
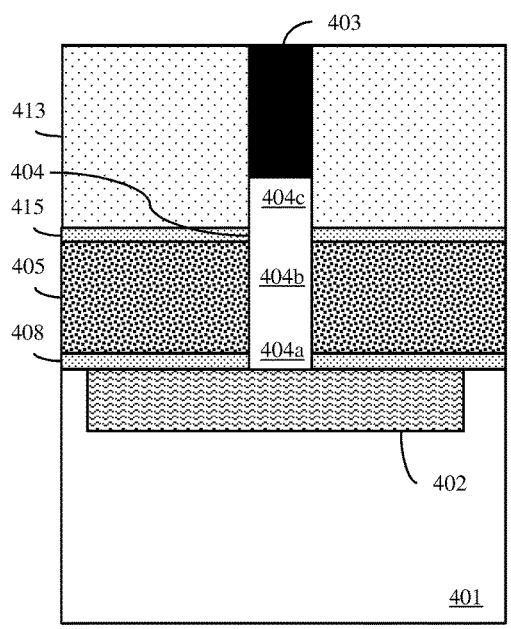
FIG. 19 is a cross-section diagram illustrating a partially completed VFET formed according to the method of FIG. 16.
Figure 20:
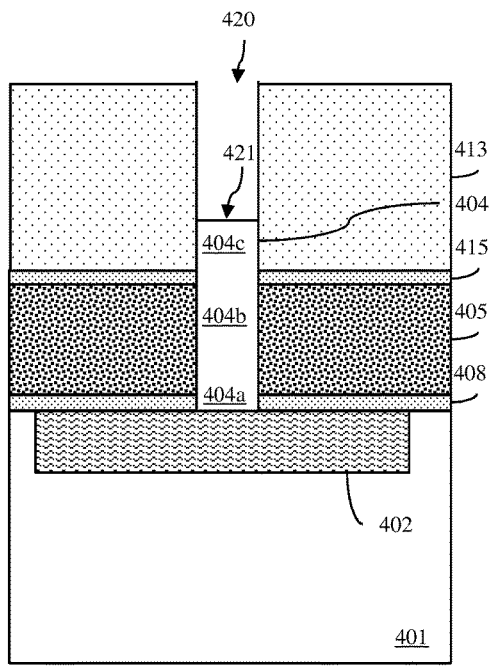
FIG. 20 is a cross-section diagram illustrating a partially completed VFET formed according to the method of FIG. 16.

A second sacrificial layer 413 can be deposited onto the second spacer layer 415, laterally surrounding and immediately adjacent to an upper region of the third portion 404c of the semiconductor fin 404 and further over the dielectric cap 403 on the semiconductor fin 404 (see process 314 and FIG. 19). The second sacrificial layer 413 can, for example, be made of silicon dioxide or some other suitable dielectric material that is different from the materials of the second spacer layer 415 and protective cap 425. The second sacrificial layer 413 can then be polished (e.g., using a CMP process) to expose the top surface of the dielectric cap 403 and the dielectric cap 403 can be selectively removed, thereby creating an opening in the second sacrificial layer 413 and exposing the top of the semiconductor fin 404 (see process 316 and FIG. 20).

Figure 21:
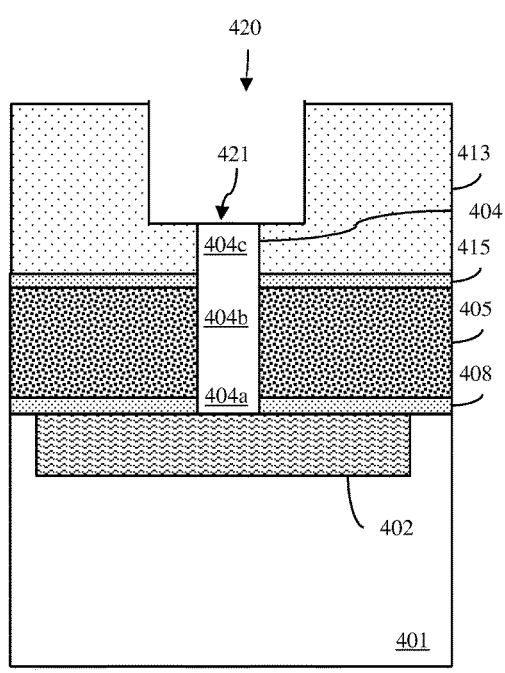
FIG. 21 is a cross-section diagram illustrating a partially completed VFET formed according to the method of FIG. 16.

The opening 420 above the semiconductor fin 404 can then be expanded (see process 318 and FIG. 21). For example, if the second sacrificial layer 413 is a silicon dioxide layer, the selective isotropic etch process can be, for example, a diluted hydrofluoric acid (DHF) wet etch process. Alternatively, the opening 420 can be expanded using conventional lithographically patterning and etch processes.

Figure 22:
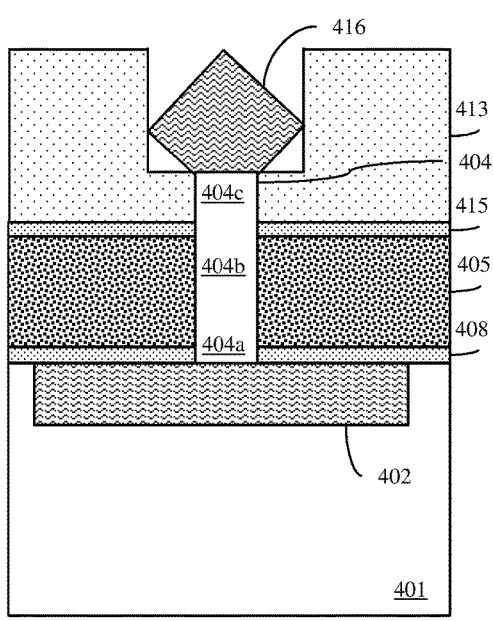
FIG. 22 is a cross-section diagram illustrating a partially completed VFET formed according to the method of FIG. 16.

Semiconductor material can then be epitaxially deposited onto the top 421 of the semiconductor fin 404 within the opening 420 in the second sacrificial layer 413 so as to form a second source/drain region 416 (see process 320 and FIG. 22). The epitaxial semiconductor material of the second source/drain region 416 can be in situ doped during deposition so that it has a second type conductivity at a relatively high conductivity level (e.g., N+ conductivity in the case of an N-type VFET or P+ conductivity in the case of a P-type VFET). Additionally, the epitaxial semiconductor material of the second source/drain region 416 and, optionally, the first source/drain region 402 (e.g., when the first source/drain region is formed as a semiconductor-filled trench) can be the same semiconductor material as that used for the semiconductor fin 204 (e.g., silicon). Alternatively, this epitaxial semiconductor material can be preselected to optimize performance depending upon the conductivity type of the VFET being formed. For example, for a P-type VFET, epitaxial semiconductor material of the upper and/or first source/drain regions can be silicon germanium (SiGe) in order to enhance majority charge carrier mobility within the P-type VFET's channel region and, thereby enhance performance. For an N-type VFET, the epitaxial semiconductor material of the upper and/or first source/drain regions can be silicon carbide (SiC), which will enhance majority charge carrier mobility within the N-type VFET's channel region and, thereby enhance performance. It should be noted that the first thickness 491 of the semiconductor fin 404 ensures that the surface area at the top of the semiconductor fin 404 is sufficiently large to enhance epitaxial growth of the semiconductor material such that the resulting second source/drain region 416 is relatively large. For example, as illustrated, the resulting second source/drain region 416 can have a large diamond shape with opposing sides that extend laterally beyond the sidewalls of the semiconductor fin 404.

Figure 23:
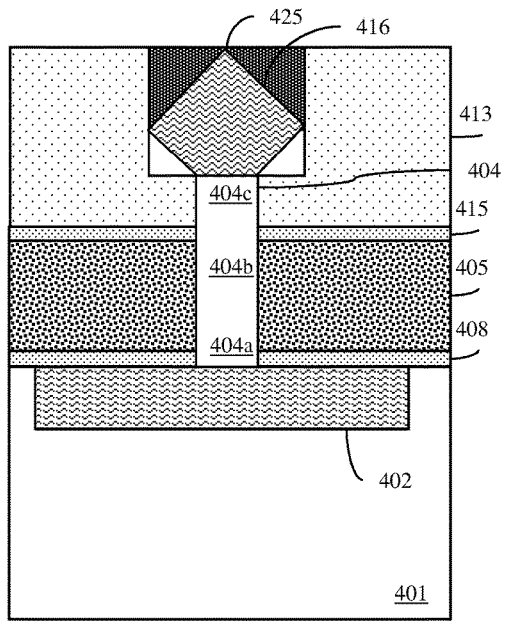
FIG. 23 is a cross-section diagram illustrating a partially completed VFET formed according to the method of FIG. 16.
Figure 24:
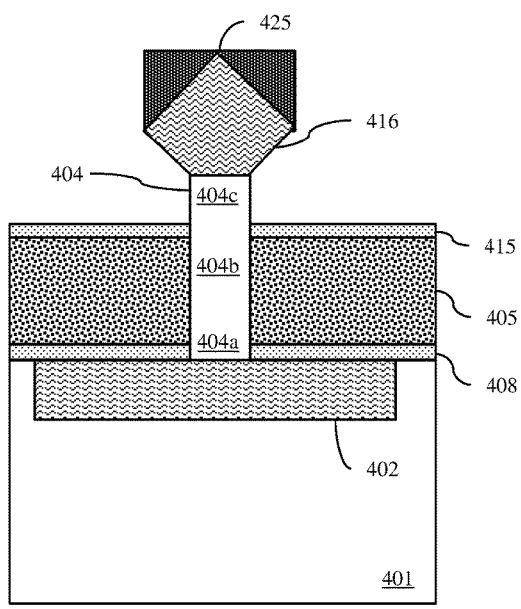
FIG. 24 is a cross-section diagram illustrating a partially completed VFET formed according to the method of FIG. 16.
Figure 25:
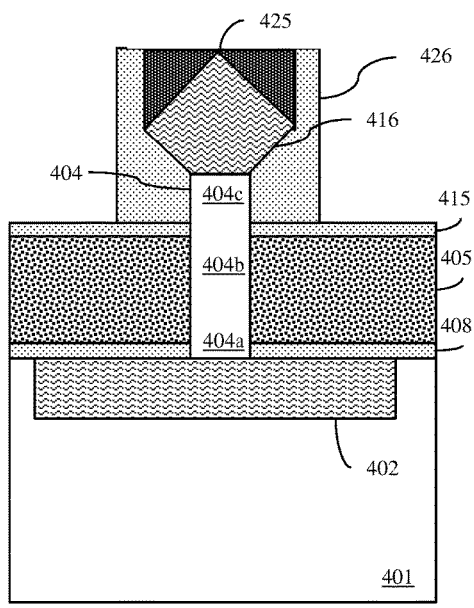
FIG. 25 is a cross-section diagram illustrating a partially completed VFET formed according to the method of FIG. 16.

Subsequently, a protective cap 425 can be formed in the opening 420 over the second source/drain region 416, the second sacrificial layer 413 can be selectively removed and a protective sidewall spacer 426 can be formed on the second spacer layer 415 so as to laterally surround and be immediately adjacent to an upper region of the third portion 404c of the semiconductor fin 404, the second source/drain region 416 and the protective cap 425 (see process 322 and FIGS. 23-25).

Specifically, at process 322, a protective cap layer can be deposited onto the second sacrificial layer 413 and within the opening 420 above the second source/drain region 416. The protective cap layer can be made of silicon nitride or some other suitable protective material that is different from the material of the second sacrificial layer 413. Next, a polishing process (e.g., a CMP process) can be performed in order to remove the protective cap layer from above the top surface of the second sacrificial layer 413, thereby forming the protective cap 425 (see FIG. 23). After the protective cap 425 is formed, the second sacrificial layer 413 can be selectively removed (see FIG. 24). For example, if the second sacrificial layer 413 is a silicon dioxide layer, the selective isotropic etch process can be, for example, a diluted hydrofluoric acid (DHF) wet etch process. Then, a protective sidewall spacer 426 can be formed above the second spacer layer 415 laterally surrounding and immediately adjacent to the upper region of the third portion 404c of the semiconductor fin 404, the second source/drain region 416 and the protective cap 425 (FIG. 25). The protective sidewall spacer 426 can be formed, for example, using conventional sidewall spacer formation techniques. That is, a relatively thin conformal protective spacer layer can be deposited over the partially completed structure. A directional etch process can then be performed in order to remove horizontal portions of the protective spacer layer from horizontal surfaces, leaving vertical portions of the protective spacer layer intact and thereby forming the protective sidewall spacer 426. The protective sidewall spacer 426 can be made, for example, of the same dielectric material used for the second spacer layer 415 (e.g., hydrogenated silicon oxycarbide (SiOCH)) and a different dielectric material than that used for the protective cap 425.

Figure 26:
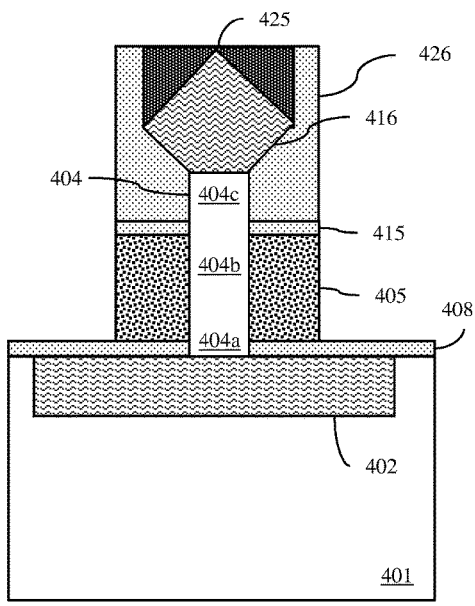
FIG. 26 is a cross-section diagram illustrating a partially completed VFET formed according to the method of FIG. 16.
Figure 27:
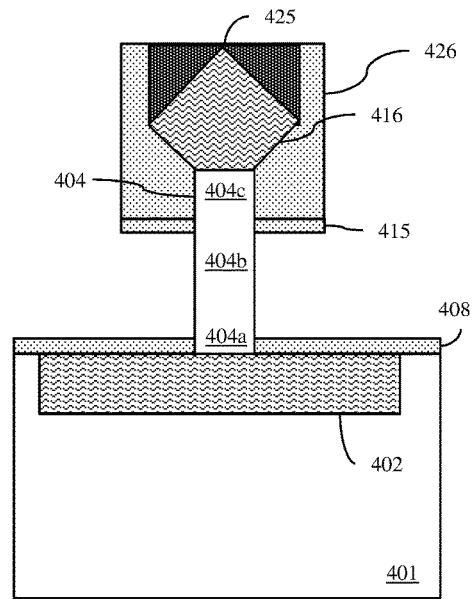
FIG. 27 is a cross-section diagram illustrating a partially completed VFET formed according to the method of FIG. 16.

Subsequently, the protective sidewall spacer 426 and protective cap 425 on the second source/drain region 416 can be used as a mask, during a directional etch process that is performed in order to remove portions of the second spacer layer 415 and the first sacrificial layer 405 that extend laterally beyond the protective sidewall spacer 426 (see process 324 and FIG. 26). Then, the remaining portion of the first sacrificial layer 405 can be selectively removed so as to expose vertical surfaces of the second portion 404b of the semiconductor fin 404. For example, if the first sacrificial layer 405 is an amorphous carbon layer, this layer can be selectively removed using an oxygen ($O_2$) plasma etch process or some other suitable etch process.

Once the first sacrificial layer 405 is selectively removed, the second portion 404b of the semiconductor fin 404 can be thinned relative to the third portion 404c at the top of the semiconductor fin 404, which is protected by the protective sidewall spacer 426, as well as the first portion 404a at the bottom of the semiconductor fin 404, which is protective by the first spacer layer 408 (see process 326). Specifically, the second portion 404b of the semiconductor fin 404 can be thinned so that the third portion 404c retains the first thickness 491 and such that the second portion 404b is thinned down to a second thickness 492, which is less than the first thickness 491. Any number of various different techniques could be performed at process 326 in order to thin the second portion 404b of the semiconductor fin 404.

Figure 28:
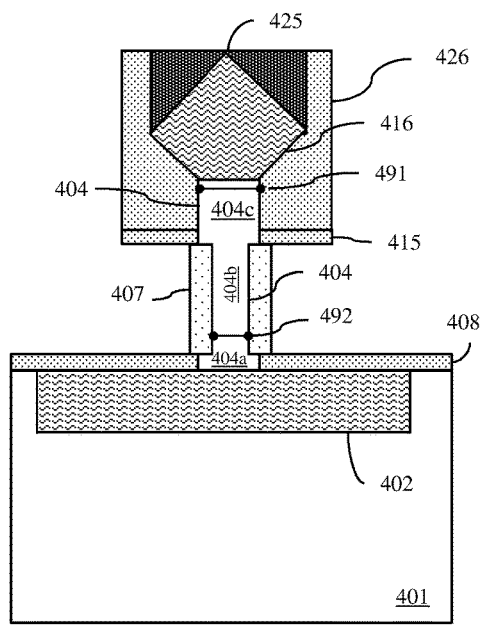
FIG. 28 is a cross-section diagram illustrating a partially completed VFET formed according to the method of FIG. 16.
Figure 29:
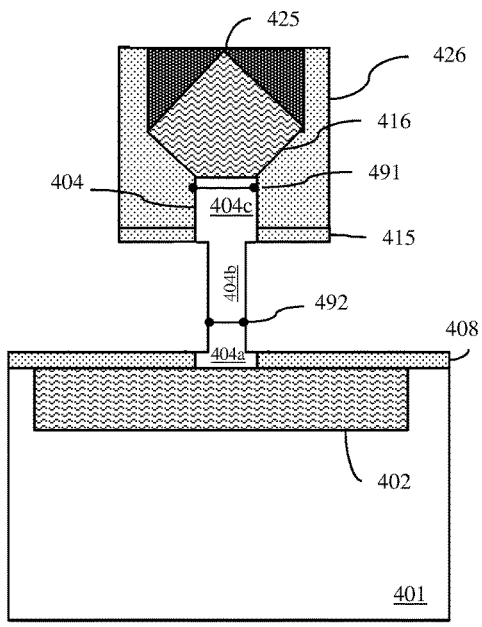
FIG. 29 is a cross-section diagram illustrating a partially completed VFET formed according to the method of FIG. 16.

For example, the exposed vertical surfaces of the second portion 404b can be oxidized using an oxidation process that consumes some of the semiconductor material of the semiconductor fin 404 at the exposed vertical surfaces, effectively thinning the second portion 404b and forming an additional sacrificial layer 407 and, particularly, a sacrificial silicon dioxide layer thereon (see process 328 and FIG. 28). As a result, the second portion 404b will have a second thickness 492 that is less than the first thickness 491. The second thickness 492 can be, for example, less than 6 nm (e.g., 5 nm). The additional sacrificial layer 407 can then be selectively removed (see process 330 and FIG. 29). For example, a diluted hydrofluoric acid (DHF) wet etch process can be used to selectively remove a sacrificial silicon dioxide layer.

Alternatively, any other suitable techniques could be used to thin the second portion 404b of the semiconductor fin 204 relative to the third portion 404c (see process 332). For example, a selective isotropic etch process, which is selective to silicon over the dielectric materials of the first spacer layer 408, the second spacer layer 415, the protective sidewall spacer 426 and the protective cap 425, can be performed. The selective isotropic etch process can be, for example, a hydrogen plasma etch, hot ammonia (NH3) wet etch process, tetramethylammonium hydroxide (TMAH) wet etch process or some other suitable etch process.

Figure 30:
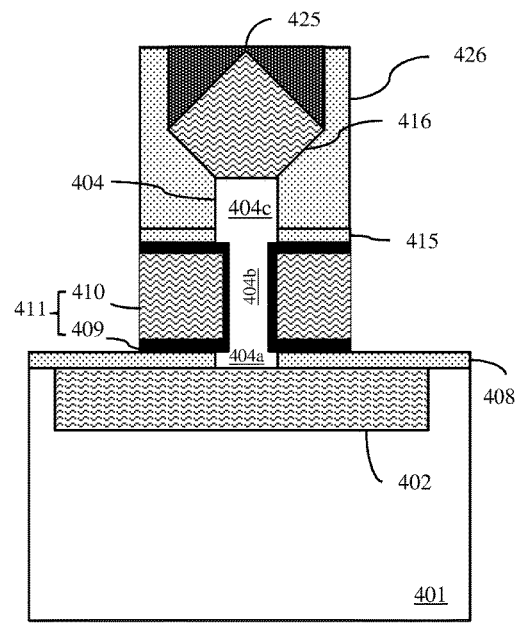
FIG. 30 is a cross-section diagram illustrating a partially completed VFET formed according to the method of FIG. 16.

Once the second portion 404b of the semiconductor fin 404 is thinned, a gate structure 411 can be formed above the first spacer layer 408, below the second spacer layer 415 and laterally surrounding and immediately adjacent to the second portion 404b of the semiconductor fin 404, thereby defining a channel region within the second portion 404b of the semiconductor fin 404 (see process 336 and FIG. 30).

For example, to form the gate structure 411, a gate dielectric layer 409 can be conformally deposited over the partially completed structure. The gate dielectric layer 409 can be made, for example, of silicon dioxide or a high-K gate dielectric material. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Techniques for conformally depositing such gate dielectric materials are well known in the art and, thus, the details have been omitted from this specification in order to allow the reader to focus on the salient aspects of the disclosed methods.

Then, at least one gate conductor layer 410 can then be conformally deposited onto the gate dielectric layer 409. The gate conductor layer 410 can be made, for example, of doped polysilicon. Alternatively, the gate conductor layer 410 can be made of a conformal work function metal immediately adjacent to the gate dielectric layer 209 and, optionally, a fill metal on the work function metal. It should be noted that the metal or metal alloy material of such a work function metal can be preselected in order to achieve the optimal gate conductor work function given the conductivity type of the VFET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten, aluminum and cobalt.

Subsequently, a polishing process (e.g., a CMP process) can be performed in order to remove gate materials from above the top surface of the protective cap 425. Then, conventional lithographic patterning and etch processes can be performed in order to achieve the desired shape for the resulting gate structure 411.

Figure 31:
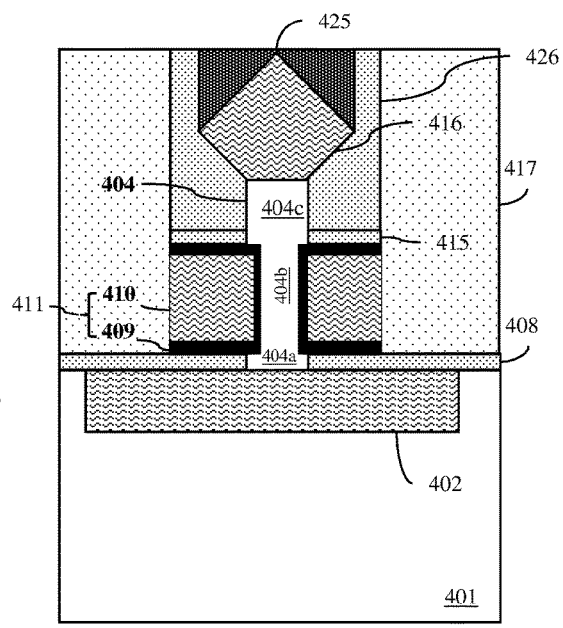
FIG. 31 is a cross-section diagram illustrating a partially completed VFET formed according to the method of FIG. 16.

Additional processing can then be performed in order to complete the VFET 400 (see process 338). The additional processing can include, for example, deposition of an interlayer dielectric (ILD) layer 417 (e.g., silicon dioxide, borophosphosilicate glass (BPSG), tetraethyl orthosilicate (TEOS), fluorinated tetraethyl orthosilicate (FTEOS), etc.); polishing of the ILD layer 417 to expose the protective cap 425 (see FIG. 31); selective removal of the protective cap 425 to expose the top surface of the second source/drain region 416 (see FIG. 32); deposition of an additional ILD layer 422 onto the second source/drain region 416, protective sidewall spacer 426 and the ILD layer 417; formation of middle of the line (MOL) contacts (e.g., see contact 418 to the second source/drain region 416); performance of back end of the line (BEOL) processing, etc. Since the second source/drain region 416 is relatively large, issues that could occur during formation of the contact 418 to the second source/drain region 416 are avoided. As mentioned above, these issues include an unlanded contact, complete silicidation of the second source/drain region during contact formation, etc.

It should be noted that, for illustration purposes, this embodiment of the method is described above and illustrated in the drawings with respect to a VFET having a single semiconductor fin. However, it should be understood that the description and drawings are not intended to be limiting. Alternatively, the VFET 400 can be formed so as to incorporate multiple semiconductor fins for increased drive current. In this case, the second portions of each semiconductor fin would be thinned as described above and a gate structure would be formed so as to laterally surround the second portions of all of the semiconductor fins.

Also disclosed herein are vertical field effect transistor (VFET) embodiments formed according to the above-described method embodiments. Specifically, referring the VFET 200A of FIG. 15A, the VFET 200B of FIG. 15B and the VFET 400 of FIG. 33, each VFET disclosed herein can each include at least a semiconductor layer 201, 401; a first source/drain region 202, 402; a semiconductor fin 204, 404;

a second source/drain region 216, 416; a first spacer layer 208, 408; a second spacer layer 215, 415; and a gate structure 211, 411.

The first source/drain region 202, 402 can be a dopant implant region within the semiconductor layer 201, 401. Alternatively, the first source/drain region 202, 402 can be a semiconductor-filled trench within the semiconductor layer 201, 401.

The semiconductor fin 204, 404 can be, for example, a silicon fin or a fin made of any other suitable semiconductor material. For purposes of this disclosure, a semiconductor fin refers to a relatively tall and thin, elongated, semiconductor body that is essentially rectangular in shape.

The semiconductor fin 204, 404 can have a first portion 204a, 404a with a bottom immediately adjacent to the first source/drain region 202, 402. The first spacer layer 208, 408 can be above and immediately adjacent to the first source/drain region 202, 402. Additionally, the first spacer layer 208, 408 can laterally surround and be immediately adjacent to the first portion 204a, 404a of the semiconductor fin 204, 404.

The semiconductor fin 204, 404 can further have a second portion 204b, 404b above the first portion 204a, 404a. The second portion 204b, 404b can contain a channel region. The gate structure 211, 411, including a gate dielectric layer 209, 409 and at least one gate conductor layer 210, 410 (as discussed in detail above with regard to the method embodiments), can be above the first spacer layer 208, 408. The gate structure 211, 411 can further laterally surround and be immediately adjacent to the second portion 204b, 404b of the semiconductor fin 204, 404.

The semiconductor fin 204, 404 can further have a third portion 204c, 404c, which is above the second portion 204b, 404b and which has a top 221, 421 immediately adjacent to the second source/drain region 216, 416. In each of the VFETs 200A, 200B and 400, this third portion 204c, 404c can encompass at least the upper $1/10^{th}$ of the semiconductor fin 204, 404 (e.g., the upper 10%, the upper 20%, the upper 30%, etc.), but no more than the upper $1/2$ of the semiconductor fin 204, 404. Additionally, the third portion 204c, 404c can be relatively thick as compared to at least the second portion 204b, 404b.

For example, in the VFET 200A of FIG. 15A and in the VFET 400 of FIG. 33, the third portion 204c, 404c of the semiconductor fin 204, 404, which is immediately adjacent to the second source/drain region 216, 416, can have a first thickness 291, 491. Furthermore, the first portion 204a, 404a, which is immediately adjacent to the first source/drain region 202, 402, can have the same first thickness 291, 491 (as illustrated) or, alternatively, can be thicker than the third portion 204c, 404c; whereas, the second portion 204b, 404b, which is between the first portion 204a, 404a and the third portion 204c, 404c and which contains a channel region, can have a second thickness 292, 492 that is less than the first thickness 291, 491. Alternatively, in the VFET 200B of FIG. 15B, the third portion 204c of the semiconductor fin 204 can have a first thickness 291. Furthermore, both the first portion 204a, which is immediately adjacent to the first source/drain region 202, and the second portion 204b, which is between the first portion 204a and the third portion 204c and which contains the channel region, can have a second thickness 292 that is less than the first thickness 291. In any case, the first thickness 291, 491 can, for example, be at least 10 nm and the second thickness 292, 492 can, for example, be less than 6 nm (e.g., 5 nm).

In the VFET 200A of FIG. 15A and the VFET 200B of FIG. 15B, the second spacer layer 215 can be above and immediately adjacent to the gate conductor layer 210 and can further laterally surround and be immediately adjacent to the third portion 204c of the semiconductor fin 204.

In this VFET 400, the second spacer layer 415 can be above and immediately adjacent to the gate dielectric layer 409 and can further laterally surround and be immediately adjacent to a lower region of the third portion 404c of the semiconductor fin 404. Additionally, a protective sidewall spacer 426 can be above the second spacer layer 415 and can laterally surround and be immediately adjacent to an upper region of the third portion 404c of the semiconductor fin 404 as well as the second source/drain region 416.

The second source/drain region 216, 416 can be made of semiconductor material epitaxially grown on the top 221, 421 of the semiconductor fin 204, 404. It should be noted that, during processing, the first thickness 291, 491 of the third portion 204c, 404c of the semiconductor fin 204, 404 ensures that the surface area at the top of the semiconductor fin 404 is sufficiently large to enhance epitaxial growth of the semiconductor material for the second source/drain region 216, 416. Thus, the resulting second source/drain region 216, 416 is relatively large. For example, as illustrated, the resulting second source/drain region 216, 416 can have a large diamond shape with opposing sides that extend laterally beyond the sidewalls of the semiconductor fin 204, 404.

In any case, the semiconductor fin 204, 404 can be undoped. Alternatively, the semiconductor fin 204, 404 can be doped so as to have a first type conductivity at a relatively low conductivity level (e.g., P− conductivity in the case of an N-type VFET or N− conductivity in the case of a P-type VFET). The first source/drain region 202, 402 and the second source/drain region 216, 416 can each be doped so as to have a second type conductivity at a relatively high conductivity level (e.g., N+ conductivity in the case of an N-type VFET or P+ conductivity in the case of a P-type VFETs). Additionally, the epitaxial semiconductor material of the second source/drain region 216, 416 and, optionally, the first source/drain region 202, 402 (e.g., when the first source/drain region is formed as a semiconductor-filled trench) can be the same semiconductor material as that used for the semiconductor fin 204, 404 (e.g., silicon). Alternatively, this epitaxial semiconductor material can be preselected to optimize performance depending upon the conductivity type of the VFET being formed. For example, for a P-type VFET, epitaxial semiconductor material of the upper and/or first source/drain regions can be silicon germanium (SiGe) in order to enhance majority charge carrier mobility within the P-type VFET's channel region and, thereby enhance performance. For an N-type VFET, the epitaxial semiconductor material of the upper and/or first source/drain regions can be silicon carbide (SiC), which will enhance majority charge carrier mobility within the N-type VFET's channel region and, thereby enhance performance.

As discussed in detail above with regard to the method embodiments, each VFET 200A, 200B and 400 disclosed herein can further include ILD material over the second source/drain region 216, 416 and middle of the line (MOL) contacts including, but not limited to, a contact 218, 418 that extends through the ILD material to the second source/drain region 216, 416. Since, as mentioned above, the second source/drain region 216, 416 is relatively large, issues that could occur during formation of the contact 218, 418 are avoided. As mentioned above, these issues include an unlanded contact, complete silicidation of the second source/drain region during contact formation, etc.

In the method and VFET structure embodiments described above, the VFETs 200A, 200B, and 400 can be N-type VFETs or P-type VFETs. As discussed, for an N-type VFET, the channel region can have P-type conductivity (or can be undoped) and the source/drain regions can have N-type conductivity; whereas, for a P-type VFET, the channel region can have N-type conductivity (or can be undoped) and the source/drain regions can have P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a semiconductor fin on a semiconductor layer, the semiconductor fin comprising a first portion, a second portion above the first portion and a third portion above the second portion;
   thinning at least the second portion such that the third portion is thicker than the second portion;
   forming a gate structure positioned laterally adjacent to the second portion, wherein the gate structure is formed on a first spacer layer that is above the semiconductor layer and positioned laterally adjacent to the first portion;
   forming a second spacer layer above the gate structure and positioned laterally adjacent to the third portion; and
   epitaxially depositing a semiconductor material on a top of the semiconductor fin so as to form a second source/drain region, wherein the first the first spacer layer is formed above the semiconductor layer and positioned laterally adjacent to the first portion before the thinning and wherein the thinning comprises: forming a first sacrificial layer on the first spacer layer and positioned laterally adjacent to the second portion; forming a sacrificial sidewall spacer above the first sacrificial layer and positioned laterally adjacent to the third portion; and selectively removing the first sacrificial layer to expose vertical surfaces of the second portion and allow the second portion to be thinned relative to the third portion.

2. The method of claim 1, further comprising forming a contact to the second source/drain region,
   wherein the third portion of the semiconductor fin remains relatively thick during processing in order to enhance epitaxial growth of the semiconductor material and ensure that the second source/drain region will be sufficiently large to avoid contact-related defects, and
   wherein the second portion of the semiconductor fin is thinned to ensure optimal transistor performance.

3. The method of claim 1, wherein the thinning further comprises:
   oxidizing the vertical surfaces to form a second sacrificial layer comprising an oxide layer on the first portion and the second portion; and
   selectively removing the sacrificial sidewall spacer and the second sacrificial layer.

4. The method of claim 1, wherein the thinning thins the first portion and the second portion, wherein the first spacer layer is formed above the semiconductor layer and positioned laterally adjacent to the first portion after the thinning and wherein the thinning comprises:
   forming a first sacrificial layer on the semiconductor layer and positioned laterally adjacent to the first portion and the second portion;
   forming a sacrificial sidewall spacer above the first sacrificial layer and positioned laterally adjacent to the third portion; and
   selectively removing the first sacrificial layer to expose vertical surfaces of the first portion and the second portion and allow the first portion and the second portion to be thinned relative to the third portion.

5. The method of claim 4, wherein the thinning further comprises:
   oxidizing the vertical surfaces to form a second sacrificial layer comprising an oxide layer on the first portion and the second portion; and
   selectively removing the sacrificial sidewall spacer and the second sacrificial layer.

6. The method of claim 1,
   wherein the semiconductor fin is formed so as to have a dielectric cap above the third portion,
   wherein the forming of the gate structure comprises:
      conformally depositing a gate dielectric layer on the first spacer layer and over the semiconductor fin;
      conformally depositing a gate conductor layer on the gate dielectric layer;
      depositing an interlayer dielectric layer on the gate conductor layer; and,
      recessing the gate conductor layer to selectively adjust a length of the gate structure, and
   wherein the forming of the second spacer layer comprises:
      depositing the second spacer layer onto the gate conductor layer and positioned laterally adjacent to the third portion and the dielectric cap; and
      performing at least one etch process to recess the second spacer layer and remove the dielectric cap.

7. The method of claim 1,
   wherein the semiconductor fin is initially formed so as to have a first thickness that is essentially uniform across the first portion, the second portion and the third portion,
   wherein the thinning of the first portion and the second portion is performed such that the first portion and the second portion have a second thickness that is less than the first thickness,
   wherein the first thickness is at least 10 nm, and
   wherein the second thickness is no greater than 6 nm.

8. A method comprising:
   forming a semiconductor fin on a semiconductor layer, the semiconductor fin comprising a first portion, a second portion above the first portion and a third portion above the second portion;
   thinning at least the second portion such that the third portion is thicker than the second portion;
   forming a gate structure positioned laterally adjacent to the second portion, wherein the gate structure is formed on a first spacer layer that is above the semiconductor layer and positioned laterally adjacent to the first portion;
   forming a second spacer layer above the gate structure and positioned laterally adjacent to the third portion; and
   epitaxially depositing a semiconductor material on a top of the semiconductor fin so as to form a second source/drain region,
   wherein the first spacer layer is formed above the semiconductor layer and positioned laterally adjacent to the first portion before the thinning and wherein the thinning comprises:
      forming a first sacrificial layer on the first spacer layer and positioned laterally adjacent to the second portion;
      forming a sacrificial sidewall spacer above the first sacrificial layer and positioned laterally adjacent to the third portion; and
      selectively removing the first sacrificial layer to expose vertical surfaces of the second portion and allow the second portion to be thinned relative to the third portion.

9. The method of claim 8, further comprising forming a contact to the second source/drain region,
   wherein the third portion of the semiconductor fin remains relatively thick during processing in order to enhance epitaxial growth of the semiconductor material and ensure that the second source/drain region will be sufficiently large to avoid contact-related defects, and
   wherein the second portion of the semiconductor fin is thinned to ensure optimal transistor performance.

10. The method of claim 8, wherein the thinning further comprises:
    oxidizing the vertical surfaces to form a second sacrificial layer comprising an oxide layer on the first portion and the second portion; and
    selectively removing the sacrificial sidewall spacer and the second sacrificial layer.

11. The method of claim 8,
    wherein the semiconductor fin is formed so as to have a dielectric cap above the third portion,
    wherein the forming of the gate structure comprises:
       conformally depositing a gate dielectric layer on the first spacer layer and over the semiconductor fin;
       conformally depositing a gate conductor layer on the gate dielectric layer;
       depositing an interlayer dielectric layer on the gate conductor layer; and,
       recessing the gate conductor layer to selectively adjust a length of the gate structure, and
    wherein the forming of the second spacer layer comprises:
       depositing the second spacer layer onto the gate conductor layer and positioned laterally adjacent to the third portion and the dielectric cap; and
       performing at least one etch process to recess the second spacer layer and remove the dielectric cap.

* * * * *